(12) United States Patent
Hsu et al.

(10) Patent No.: US 11,022,894 B2
(45) Date of Patent: Jun. 1, 2021

(54) RULE-BASED DEPLOYMENT OF ASSIST FEATURES

(71) Applicant: ASML Netherlands B.V., Veldhoven (NL)

(72) Inventors: Duan-Fu Stephen Hsu, Fremont, CA (US); Kurt E. Wampler, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/440,485

(22) Filed: Jun. 13, 2019

(65) Prior Publication Data

US 2019/0294053 A1 Sep. 26, 2019

Related U.S. Application Data

(63) Continuation of application No. 15/512,540, filed as application No. PCT/EP2015/071861 on Sep. 23, 2015, now Pat. No. 10,331,039.

(60) Provisional application No. 62/219,442, filed on Sep. 16, 2015, provisional application No. 62/059,036, filed on Oct. 2, 2014.

(51) Int. Cl.
*G03F 7/20* (2006.01)
*G03F 1/36* (2012.01)

(52) U.S. Cl.
CPC .......... *G03F 7/70441* (2013.01); *G03F 1/36* (2013.01); *G03F 7/70125* (2013.01)

(58) Field of Classification Search
CPC ..... G03F 7/70441; G03F 1/36; G03F 7/70125

USPC .......................................................... 716/55
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |

(Continued)

FOREIGN PATENT DOCUMENTS

| CN | 1480985 | 3/2004 |
| CN | 1828613 | 9/2006 |

(Continued)

OTHER PUBLICATIONS

International Search Report and Written Opinion dated Dec. 11, 2015 in corresponding International Patent Application No. PCT/EP2015/071861.

(Continued)

*Primary Examiner* — Suresh Memula
(74) *Attorney, Agent, or Firm* — Pillsbury Winthrop Shaw Pittman LLP

(57) ABSTRACT

Several methods of reducing one or more pattern displacement errors, contrast loss, best focus shift, tilt of a Bossung curve of a portion of a design layout used in a patterning process for imaging that portion onto a substrate using a lithographic apparatus. The methods include determining or adjusting one or more characteristics of one or more assist features using the one or more rules based on one or more parameters selected from a group consisting of: one or more characteristics of one or more design features in the portion, one or more characteristics of the patterning process, one or more characteristics of the lithographic apparatus, and/or a combination selected from the foregoing.

22 Claims, 29 Drawing Sheets

(56) References Cited

U.S. PATENT DOCUMENTS

| | | | |
|---|---|---|---|
| 5,969,441 | A | 10/1999 | Loopstra et al. |
| 6,046,792 | A | 4/2000 | Van Der Werf et al. |
| 6,777,147 | B1 | 8/2004 | Fonseca et al. |
| 6,809,797 | B2 | 10/2004 | Baselmans et al. |
| 7,003,758 | B2 | 2/2006 | Ye et al. |
| 7,200,835 | B2 | 4/2007 | Zhang et al. |
| 7,475,382 | B2 | 1/2009 | Melvin et al. |
| 7,587,704 | B2 | 9/2009 | Ye et al. |
| 8,182,969 | B2 | 5/2012 | Hsu et al. |
| 8,200,468 | B2 | 6/2012 | Ye et al. |
| 8,365,107 | B2 | 1/2013 | Tyminski et al. |
| 8,438,508 | B2 | 5/2013 | Liu |
| 8,554,510 | B2 | 10/2013 | Staals et al. |
| 8,786,824 | B2 | 7/2014 | Hansen |
| 2002/0155357 | A1 | 10/2002 | Lacour |
| 2005/0136340 | A1 | 6/2005 | Baselmans et al. |
| 2005/0251771 | A1 | 11/2005 | Robles |
| 2006/0188673 | A1 | 8/2006 | Melvin et al. |
| 2006/0190919 | A1* | 8/2006 | Zhang .................. G03F 1/36 716/54 |
| 2010/0315614 | A1 | 12/2010 | Hansen |
| 2010/0333046 | A1 | 12/2010 | Yune et al. |
| 2014/0038087 | A1 | 2/2014 | Gallagher et al. |
| 2014/0040838 | A1 | 2/2014 | Liu et al. |
| 2017/0082927 | A1 | 3/2017 | Hsu et al. |
| 2017/0184979 | A1 | 6/2017 | Hsu et al. |

FOREIGN PATENT DOCUMENTS

| | | |
|---|---|---|
| CN | 101164070 | 4/2008 |
| JP | 2003536058 | 12/2003 |
| JP | 2006502422 | 1/2006 |
| JP | 4309955 | 5/2009 |
| TW | 512427 | 12/2002 |
| TW | 201131314 | 9/2011 |
| WO | WO 2010/059954 | 5/2010 |
| WO | WO 2015/139951 | 9/2015 |

OTHER PUBLICATIONS

Liu, Xiaofeng et al., "EUV source-mask optimization for 7nm node and beyond", Proceedings of SPIE, vol. 9048, pp. 90480Q-1-90480Q-11 (Apr. 17, 2014).

Burkhardt, Martin et al., "Clear Sub-Resolution Assist Features for EUV",Proceedings of SPIE, vol. 9048, pp. 904838-1-904838-7 (Apr. 17, 2014).

Spence, Chris, "Full-Chip Lithography Simulation and Design Analysis—How OPC is Changing IC Design," Proc. SPIE, vol. 5751, pp. 1-14 (2005).

Cao , Yu et al., "Optimized Hardware and Software for Fast, Full Chip Simulation," Proc. of SPIE, vol. 5754, pp. 407-414 (2005).

Rosenbluth, Alan E. et al., "Optimum mask and source patterns to print a given shape," J. Microlith., Microfab., Microsys., vol. 1, No. 1, pp. 13-30 (Apr. 2002).

Granik, Yuri, "Source optimization for image fidelity and throughput," J. Microlith., Microfab., Microsys., vol. 3, No. 4, pp. 509-522 (Oct. 2004).

Socha, Robert et al., "Simultaneous Source Mask Optimization (SMO)," Proc. of SPIE, vol. 5853, pp. 180-193 (2005).

Hsu, Stephen, "An Innovative Source-Mask co-Optimization (SMO) Method for Extending Low k1 Imaging", Proceedings of SPIE, vol. 7140, pp. 714010-1-714010-10 (2008).

Disclosed Anonymously, "Defect Prediction," Research Disclosure, Database No. 604033, pp. 1-7 (Jul. 18, 2014).

Huang, Thomas et al., "Improvement of lithography process by using a FlexRay illuminator for memory applications," Proc. of SPIE, vol. 7973, pp. 79731X-1-79731X-11 (2011).

English translation of Taiwan Office Action dated May 1, 2017 in corresponding Taiwan Patent Application No. 104132432.

Chinese Office Action dated Feb. 12, 2018 in corresponding Chinese Patent Application No. 201580053694.8.

Kang, Hoyoung, et al.: "Novel assist feature design to improve depth of focus in low k1 EUV lithography", Proc. of SPIE, vol. 7520, pp. 752037-1-752037-7.

Hsu, Stephen, et al.: "EUV Resolution Enhancement Techniques (RETs) for k1 0.4 and below", Proc. of SPIE, vol. 9422, pp. 94221I-1-94221I-16, (2009).

Ng, Philip C.W., et al.: "Fully model-based methodology for simultaneous correction of extreme ultraviolet mask shadowing and proximity effects", J. Micro/Nanolith. MEMS MOEMS, Jan.-Mar. 2011, vol. 10(1), pp. 013004-1-013004-13.

Final Office Action issued in corresponding U.S. Appl. No. 15/325,428, dated Sep. 7, 2018.

Korean Notice of Allowance issued in corresponding Korean Patent Application No. 2019-085177970, dated Nov. 25, 2019.

Notice of Allowance issued in corresponding U.S. Appl. No. 16/428,373, dated Nov. 13, 2020.

U.S. Office Action issued in corresponding U.S. Appl. No. 16/428,373, dated May 15, 2020.

* cited by examiner

4410

0.00

4411  4410  4412

0.00

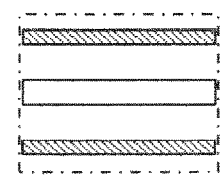
Figure 7A
Figure 7B
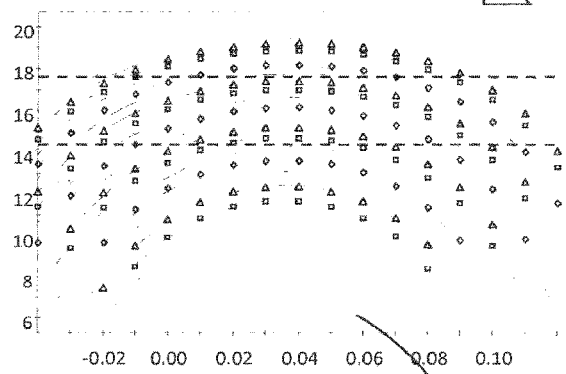
Figure 7C
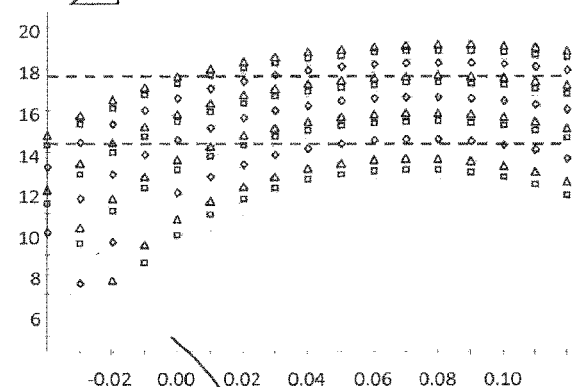
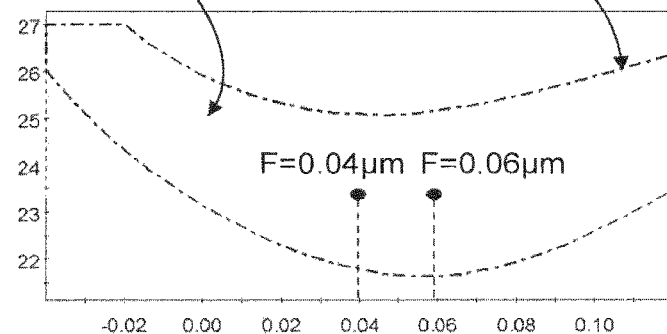
Figure 7D

RULE-BASED DEPLOYMENT OF ASSIST FEATURES

This application is a continuation of U.S. patent application Ser. No. 15/512,540, which was filed on Mar. 17, 2017, now allowed, which is the U.S. national phase entry of PCT patent application no. PCT/EP2015/071861, which was filed on Sep. 23, 2015, which claims the benefit of priority of U.S. provisional application No. 62/059,036 which was filed on Oct. 2, 2014 and U.S. provisional application No. 62/219,442 which was filed on Sep. 16, 2015, each of the foregoing applications is incorporated herein in its entirety by reference.

TECHNICAL FIELD

The description herein relates to lithographic apparatuses and processes, and more particularly to a method or tool for optimization of an illumination source or patterning device for use in a lithographic apparatus or process.

BACKGROUND

A lithographic apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatuses, the circuit pattern on the entire patterning device is transferred onto one target portion in one go; such an apparatus is commonly referred to as a substrate stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

SUMMARY

Disclosed herein is a computer-implemented method to improve a patterning process for imaging a portion of a design layout onto a substrate using a lithographic apparatus, the method comprising: obtaining one or more rules that configured to determine one or more characteristics of one or more assist features based on one or more parameters selected from a group consisting of: one or more characteristics of one or more design features in the portion, one or more characteristics of the patterning process, one or more characteristics of the lithographic apparatus, and/or a combination selected from the foregoing; determining the one or more characteristics of the one or more assist features using the one or more rules; wherein the one or more parameters comprise a spacing between a pair of facing edges; wherein the one or more rules are configured to determine a distance between the one or more assist features and one of the pair of edges based on a spacing between the pair of edges such that the one or more assist features are asymmetrical with respect to the pair of edges; placing the one or more assist features onto the a patterning device.

Also disclosed herein is a computer-implemented method to improve a patterning process for imaging a portion of a design layout onto a substrate using a lithographic apparatus, the portion comprising one or more assist features, the method comprising: obtaining one or more rules configured to adjust one or more characteristics of the assist features based on one or more parameters selected from a group consisting of one or more characteristics of: one or more design features in the portion, one or more characteristics of the patterning process, one or more characteristics of the lithographic apparatus, and/or a combination selected from the foregoing; wherein the one or more rules are configured to adjust a distance between the one or more assist features and one of the pair of edges based on a spacing between the pair of edges such that the one or more assist features are asymmetrical with respect to the pair of edges; placing the one or more assist features onto a patterning device.

Also disclosed herein is a computer program product comprising a non-transitory computer readable medium having instructions recorded thereon, the instructions when executed by a computer implementing the method above.

Also disclosed herein is a computer program product comprising a non-transitory computer readable medium having one or more rules recorded thereon, wherein the one or more rules determine one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing.

Also disclosed herein is a computer program product comprising a non-transitory computer readable medium having one or more rules recorded thereon, wherein the one or more rules adjust one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing.

Also disclosed herein is a computer program product comprising a non-transitory computer readable medium having instructions recorded thereon, the instructions when executed by a computer determining one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing.

Also disclosed herein is a computer program product comprising a non-transitory computer readable medium having instructions recorded thereon, the instructions when executed by a computer adjusting one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIGS. 2A-2C schematically show light paths between a dipole illumination pupil and a projection pupil;

FIGS. 7A, 7B, 7C and 7D show that assist features can affect the symmetry of the Bossung curves because assist features cause phase shift between zero diffraction order and higher diffraction orders;

DETAILED DESCRIPTION

Figure 1A:
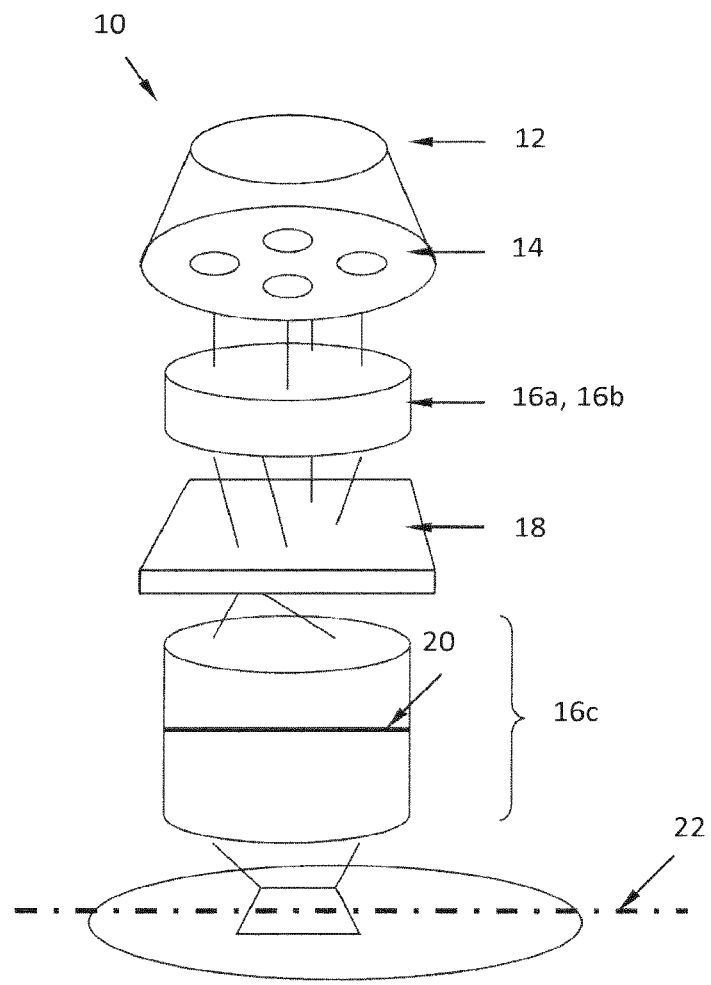
FIG. 1A is a block diagram of various subsystems of a lithography system according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic apparatuses that project a design layout onto a substrate using illumination from a deep-ultraviolet (e.g., 13.52 nm) illumination source or an extreme-ultraviolet illumination source, creating individual functional elements having dimensions well below 30 nm.

This process in which features with dimensions smaller than the classical resolution limit of a lithographic apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic apparatus, no matter where the optical component is located on an optical path of the lithographic apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein and may include both transmissive and reflective patterning devices. Also, person skilled in the art will recognize that, especially in the context of lithography simulation/optimization, the term "mask," "patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an exact science, but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

One of the simplest forms of OPC is selective bias. Given a CD vs. pitch curve, all of the different pitches could be forced to produce the same CD, at least at best focus and exposure, by changing the CD at the mask level. Thus, if a feature prints too small at the substrate level, the mask level feature would be biased to be slightly larger than nominal, and vice versa. Since the pattern transfer process from mask level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the design feature without being fully resolved on their own. A "design feature" as used herein means a feature intended to print on a substrate under some or all conditions in the process window and having some function in the circuits eventually produced. Assist features can take on much more aggressive forms than simple hammerheads added to line ends, to the extent the pattern on the mask is no longer simply the desired substrate pattern upsized by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the substrate level. In general, the mask pattern becomes a pre-distorted version of the substrate-level pattern, where the distortion is intended to counteract or reverse the pattern deformation that will occur during the patterning process to produce a pattern on the substrate that is as close to the one intended by the designer as possible. A patterning process may include a lithographic process, etching, imprint or other processes that may be used in forming patterns on a substrate.

Another OPC technique involves using completely independent and non-resolvable assist features, instead of or in addition to those assist features (e.g., serifs) connected to the design features. The term "independent" here means that edges of these assist features are not connected to edges of the design features. These independent assist features are not intended or desired to print as features on the substrate, but rather are intended to modify the aerial image of a nearby design feature to enhance the printability and process tolerance of that design feature. These assist features (often referred to as "scattering bars" or "SBAR") can include sub-resolution assist features (SRAF) which are features outside edges of the design features and sub-resolution inverse features (SRIF) which are features scooped out from inside the edges of the design features. The presence of SBAR adds yet another layer of complexity to a mask. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik s method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic apparatus, for example, parameters a user of the lithographic apparatus can adjust. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and patterning device optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

Although specific reference may be made in this text to the use of the embodiments in the manufacture of ICs, it should be explicitly understood that the embodiments has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as interchangeable with the more general terms "mask," "substrate" and "target portion," respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a patterning process or an apparatus involved in the patterning process such that results and/or processes of patterning have more desirable characteristics, such as higher accuracy of projection of design layouts on a substrate, larger process windows, etc.

Further, the lithographic apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic apparatuses are described, for example, in U.S. Pat. No. 5,969,441, incorporated herein by reference.

The patterning device referred to above comprise design layouts. The design layouts can be generated utilizing CAD (computer-aided design) programs, this process often being referred to as EDA (electronic design automation). Most CAD programs follow a set of design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. One of the goals in integrated circuit fabrication is to faithfully reproduce the original circuit design on the substrate (via the patterning device).

The term patterning device as employed in this text may be broadly interpreted as referring to generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The matrix addressing can be performed using suitable electronics. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1B:
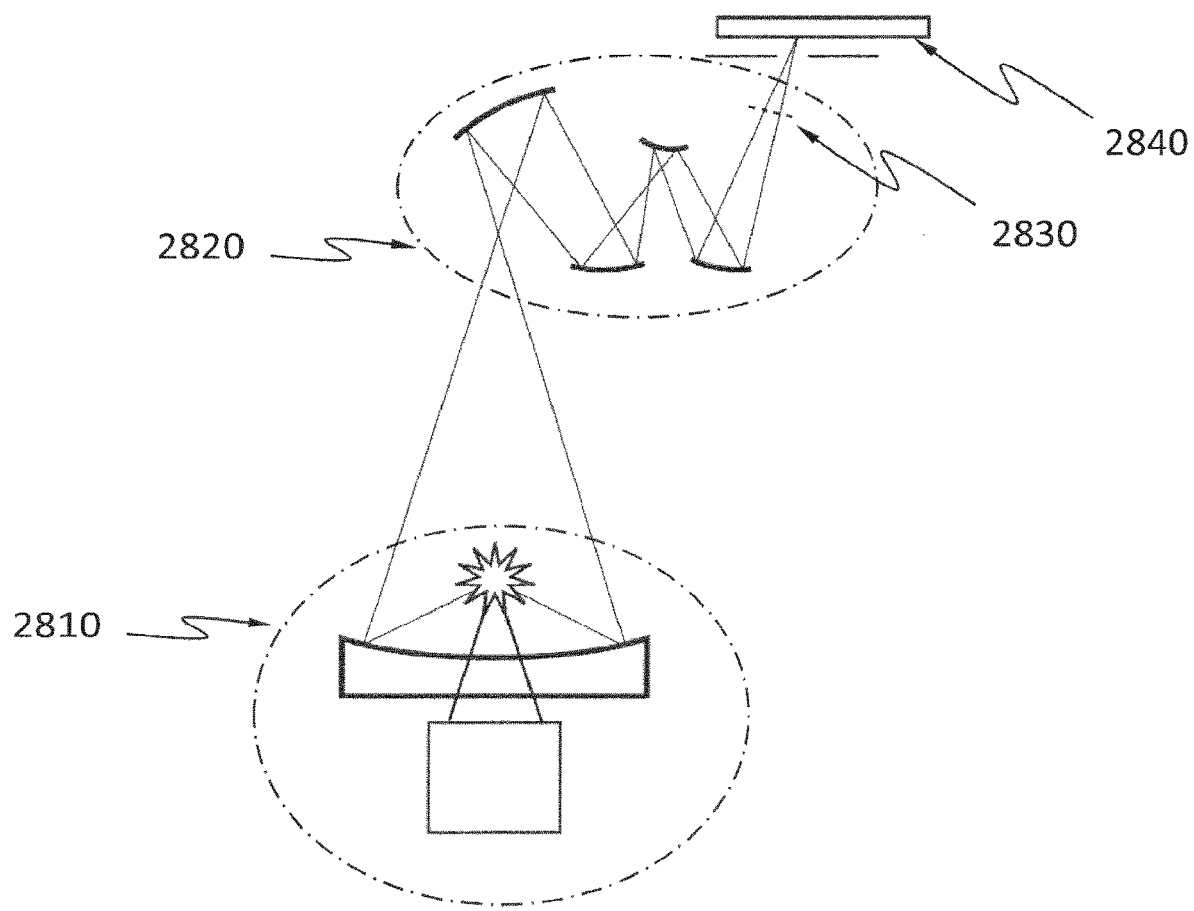
FIG. 1B shows a schematic of an illumination source.

As a brief introduction, FIG. 1A illustrates a lithographic apparatus. Major components are an illumination source 12, which may be a deep-ultraviolet excimer laser source or other type of sources including extreme ultra violet (EUV) sources, illumination optics which define the partial coherence (denoted as sigma) and which may include optics 14, 16a and 16b that shape radiation from the source 12; a patterning device (e.g., a mask or reticle) 18; and transmission optics 16c that project an image of the patterning device pattern onto a substrate plane 22. An adjustable filter or aperture 20 at the pupil plane of the projection optics may restrict the range of beam angles that impinge on the substrate plane 22, where the largest possible angle defines the numerical aperture of the projection optics NA=sin ($\Theta_{max}$). The term "source" and "illumination source" as used herein may include illumination optics. For example, FIG. 1B shows an EUV illumination source including a source collector module 2810 and illumination optics 2820. In the source collector module 2810, EUV radiation may be produced by a plasma. The EUV radiation is then shaped by the illumination optics 2820 and directed to a patterning device 2840. A pupil at a plane between the patterning device 2840 and the illumination optics 2820 may be referred to as an illumination pupil. The "shape" of the illumination source refers to the intensity and/or phase distribution at the illumination pupil.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations. The term "evaluation points" herein should be interpreted broadly to include any characteristics of the system. The design variables of the system can be confined to finite ranges and/or be interdependent due to practicalities of implementations of the system. In case of a lithographic apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic apparatus, a source provides illumination (i.e. radiation); projection optics direct and shapes the illumination via a patterning device and onto a substrate. The term "projection optics" is broadly defined here to include any optical component that may alter the wavefront of the radiation beam. For example, projection optics may include at least some of the components 14, 16a, 16b and 16c. An aerial image (AI) is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic apparatus (e.g., properties of the source, the patterning device and the projection optics) dictate the aerial image. Since the patterning device used in the lithographic apparatus can be changed, it is desirable to separate the optical properties of the patterning device from the optical properties of the rest of the lithographic apparatus including at least the source and the projection optics.

Figure 1C:
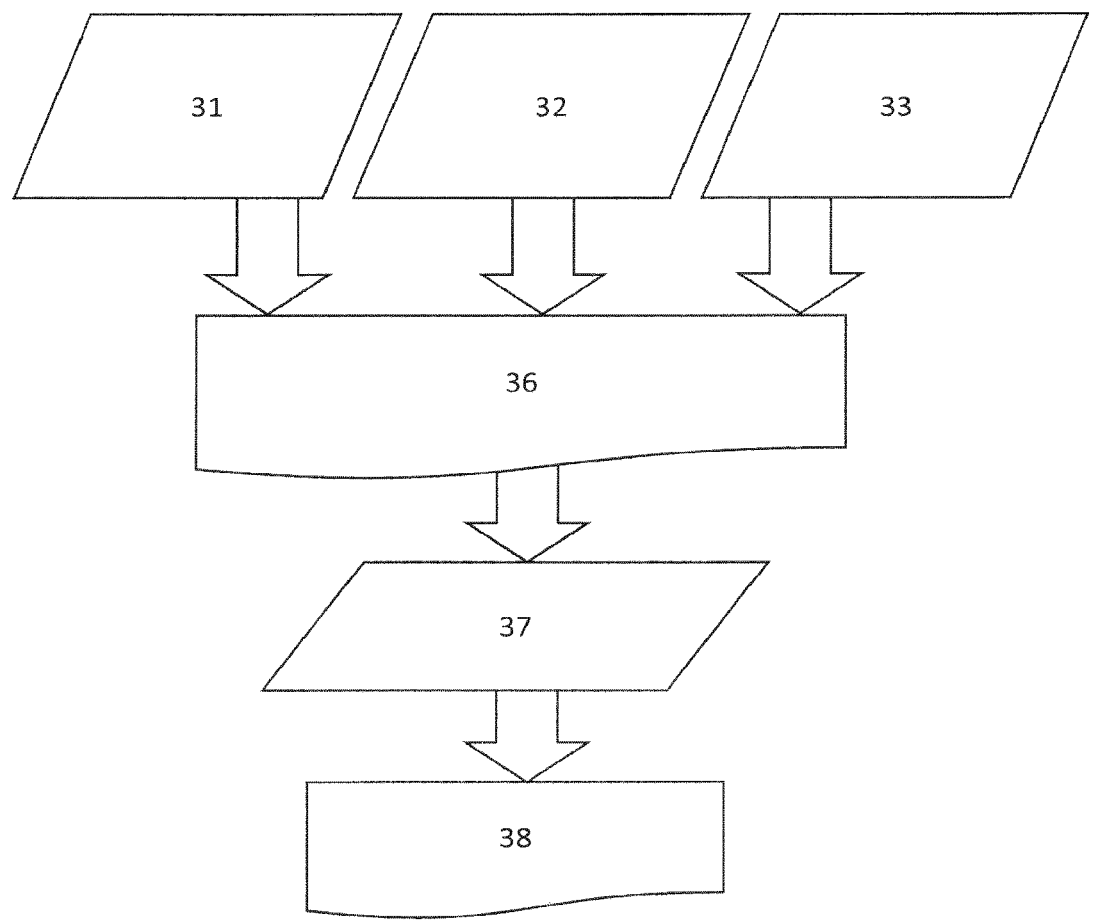
FIG. 1C is a block diagram of simulation models corresponding to the subsystems in FIG. 1A.

A flow chart for simulating lithography in a lithographic apparatus is illustrated in FIG. 1C. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. The projection optics model 32 may include aberration caused by various factors, for example, heating of the components of the projection optics, stress caused by mechanical connections of the components of the projection optics. The source model 31 and the projection optics model 32 can be combined into a transmission cross coefficient (TCC) model. A design layout model 33 represents optical characteristics (including changes to the radiation intensity distribution and/or the phase distribution caused by a given design layout) of a design layout, which is the representation of an arrangement of features of a patterning device. An aerial image 36 can be simulated from the source model 31, the projection optics model 32 and the design layout model 33. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, absorption, etc. The design layout model 33 can also represent physical properties of a physical patterning device, as described, for example, in U.S. Pat. No. 7,587,704, which is incorporated by reference in its entirety. The objective of the simulation is to accurately predict, for example, edge placements and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips." In a specific embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Examples of optimization methods can be found, for example, in U.S. patent application Ser. No. 12/914,946 filed Oct. 28, 2010, the disclosure of which is hereby incorporated by reference in its entirety.

Many physical effects may be adverse to the patterning process. One such effect is pattern displacement error (PDE), also known as pattern shift error. This error is a measurement of the shift of a pattern from its intended location in a simulated or actual image (e.g., aerial image, resist image, and etched image). Sometimes, the pattern displacement error is pattern-independent, i.e., the error being the same for all the patterns on the patterning device. A pattern-independent pattern displacement error is relatively easy to compensate for or correct, for example, by shifting the patterning device or the substrate. Sometimes, the pattern displacement error is pattern-dependent, which makes its compensation or correction more difficult. The shift may be caused by a variety of reasons, such as non-uniform distortion of the patterning device due to heating or mechanical force. The reasons for the shift may also include configuration of the lithographic apparatus, such as finite heights of the patterns on a patterning device (i.e., 3-D effect), pattern-dependent incident or exit angles, non-uniform intensity of zero order diffraction order from different positions of the illumination pupil, and distortion or non-telecentricity of the projection optics. In certain lithographic apparatuses, the patterning device is reflective instead of transmissive. A reflective patterning device may have absorbing materials on a surface that form the patterns to be transferred to a substrate. These absorbing materials may have a finite (non-negligible) height. The angle of incidence of radiation from the source at the reflective patterning device may be non-zero. The angle of incidence at a location on the patterning device may be different for radiation from different parts of the illumination pupil. The angle of incidence at different locations for radiation from the same part of the illumination pupil may be different. Another consequence of the reflective patterning device combined with non-zero angle of incidence is unbalance of intensity in diffraction orders from the source.

Another such effect is the best focus shift. The term "best focus shift" means that the best focus of one feature on the patterning layout may be different from the best focus of another feature.

Figure 2B:
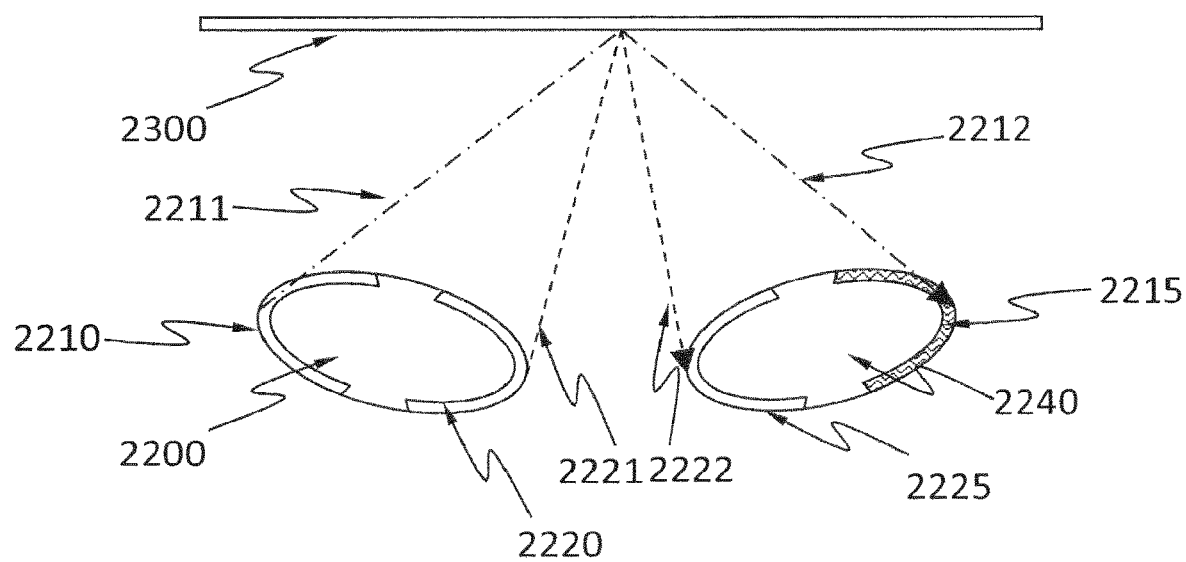
Figure 2B:
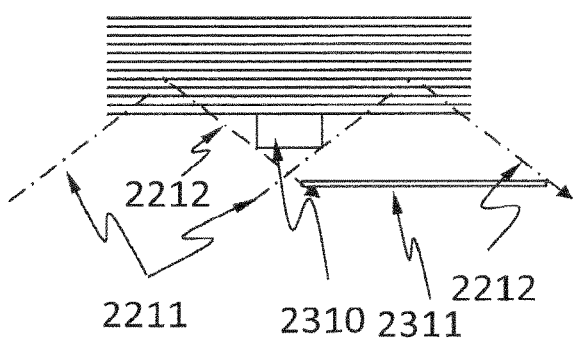
Figure 2C:
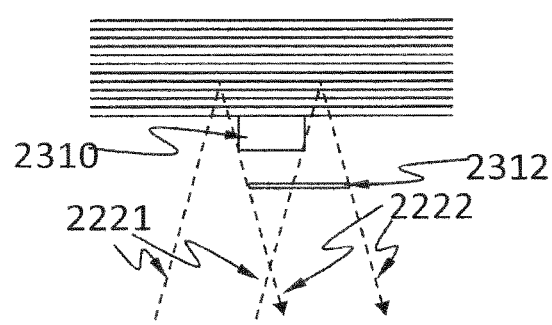

As an example to demonstrate the contribution of a reflective patterning device and non-zero angle of incidence on the patterning process, FIG. 2A schematically shows an example of dipole illumination pupil 2200 illuminating a reflective patterning device 2300. The dipole illumination pupil 2200 has two poles 2210 and 2220. The radiation from one pole 2210 is incident on the patterning device 2300 along path 2211, and diffracts along path 2212 at the zero order. The radiation from the other pole 2220 is incident on the patterning device 2300 along path 2221, and diffracts along path 2222 at the zero order. The incident angles of the radiation from the two poles are different at the same pattern 2310 on the patterning device 2300. FIG. 2B shows the shadow width 2311 of the pattern 2310 with respect to pole 2210. FIG. 2C shows the shadow width 2312 of the pattern 2310 with respect to pole 2220. The shadow width 2311 is greater than the shadow width 2312 because of the different angles of incidence for these poles. Within the shadow width, incident radiation is absorbed by the pattern 2310. As a result, at the projection pupil 2240, the zero order diffraction 2215 of pole 2210 has a lower intensity (depicted by the wiggly hatching) than the zero order diffraction 2225 of pole 2220. This difference of intensity between the zero order diffractions may lead to PDE. Difference of intensity between the first order diffractions may lead to contrast loss.

PDE, best focus shift and contrast loss may adversely affect the patterning process by reducing the process window. The process window may be defined as a space of process window metrics (e.g., EL and DOF) in which the patterning process is "in spec"—a varieties of criteria being satisfied (e.g., throughput, likelihood of defects, etc.). The reduction of the process window may be manifested in a tilted Bossung curve. A Bossung curve (also known as Bossung plot) shows dependence of the CD of a particular feature on focus under a constant dose. A tilted Bossung curve means that the curve is asymmetric with respect a value of focus.

Figure 3:
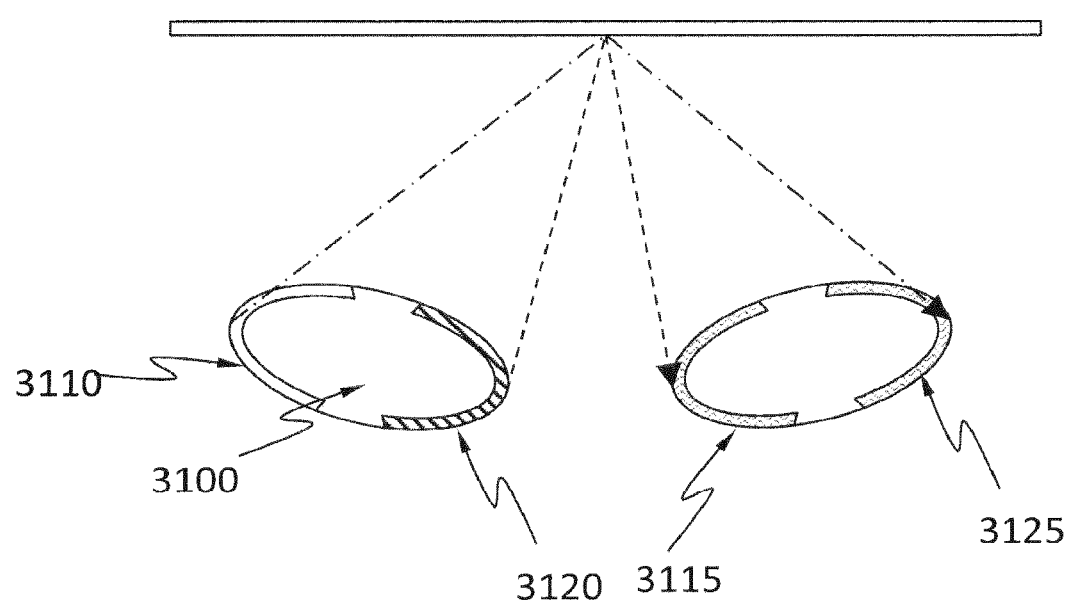
FIG. 3 schematically shows an example of a dipole illumination pupil with unbalanced poles.

The shape of the illumination source (i.e., the intensity and/or phase distribution of an illumination pupil) can be used to compensate for PDE, contrast loss and best focus shift and thereby enlarging the process window. FIG. 3 schematically shows an example of a dipole source 3100 with unbalanced poles 3110 and 3120, where the intensity of pole 3110 is greater than the intensity of pole 3120. This unbalance compensates for the difference of intensity between the zero order diffractions, i.e., causes the zero order diffractions to have the same intensity, and thus corrects PDE. This unbalance can also compensate for the contrast loss caused by the difference of intensity between the first order diffractions.

Figure 4A:
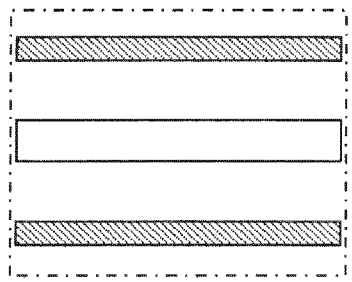
FIGS. 4A, 4B and 4C demonstrate that the source affects pattern displacement error (PDE)
Figure 4B:
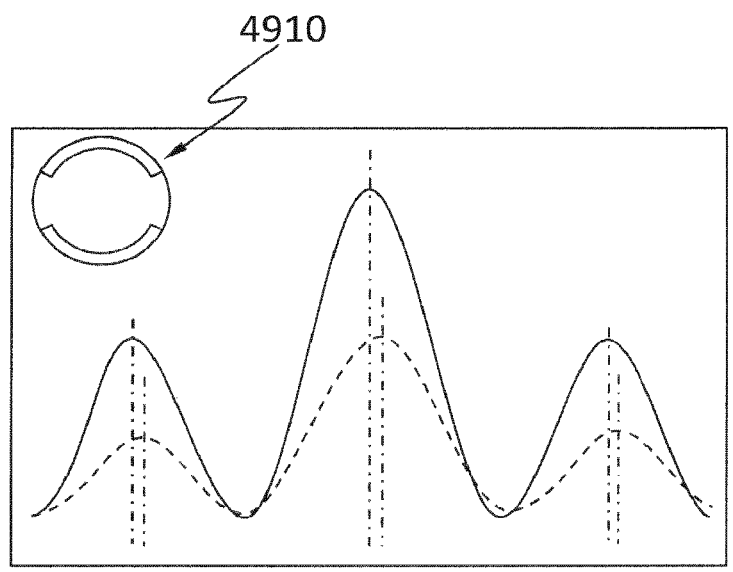
Figure 4C:
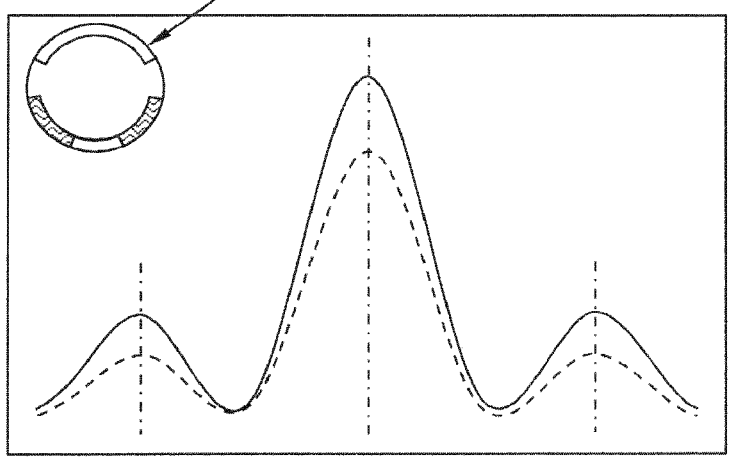

FIGS. 4A-4C demonstrate that the source affects PDE. As shown in FIG. 4A, a patterning device with a design feature and two symmetrical assist features on a reflective patterning device is used for this demonstration. FIG. 4B shows an aerial image (solid line) of the patterning device of FIG. 4A simulated using a symmetrical dipole source 4910 with the thickness of the absorbing material on the patterning device assumed to be zero, and an aerial image (dotted line) of the patterning device of FIG. 4A simulated with the electromagnetic effect of the non-zero thickness of the absorbing material taken into account. FIG. 4C shows an aerial image (solid line) of the patterning device of FIG. 4A simulated using an asymmetrical illumination pupil 4920 with the thickness of the absorbing material on the patterning device assumed to be zero, and an aerial image (dotted line) of the patterning device of FIG. 4A simulated with the electromagnetic effect of the non-zero thickness of the absorbing material taken into account. The area of the asymmetrical illumination pupil 4920 with wiggly hatch has a lower intensity than the unhatched areas. The asymmetrical illumination pupil 4920 makes the aerial images of the design feature independent from whether the thickness of the absorbing material on the patterning device is taken into account.

An example of a method to optimize the source to reduce PDE may be found in commonly assigned U.S. Patent Application Ser. No. 61/955,015, published as PCT Patent Application Publication No. WO 2015/139951, which is incorporated herein by reference in its entirety.

Figure 5A:
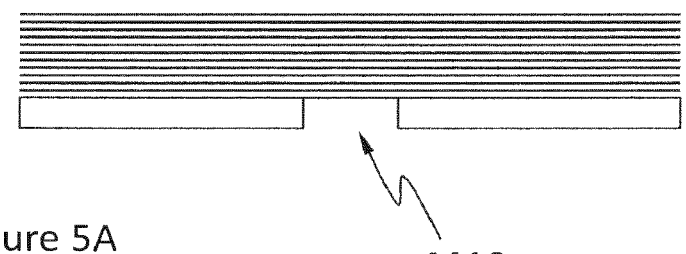
FIGS. 5A, 5B, 5C and 5D show the effect of assist features on PDE, contrast loss, best focus shift and the process window, as manifested by tilted Bossung curves.
Figure 5B:
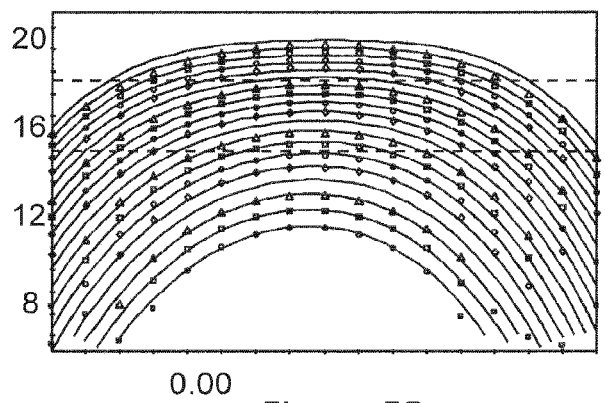
Figure 5C:
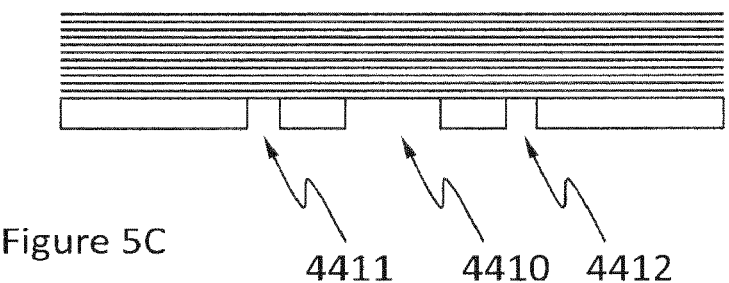
Figure 5D:
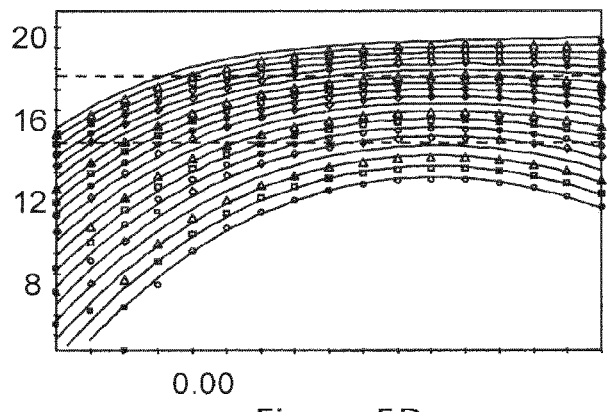

Assist features may reduce contrast loss but they may at the same time lead to higher PDE and best focus shift. According to an embodiment, adjusting positions, numbers, shapes, transmission, phase of the assist features may retain the benefit (e.g., smaller contrast loss) and reduce their contribution to PDE and best focus shift. FIGS. 5A, 5B, 5C and 5D show the effect of assist features as manifested by Bossung curves. Using a simulation with the electromagnetic effect of the non-zero thickness of the absorbing material taken into account ("rigorous simulation"), the Bossung curves for a design feature 4410 without any assist features as in FIG. 5A are obtained and essentially symmetric as shown in FIG. 5B (CD as the vertical axis and focus as the horizontal axis), and the Bossung curves for the same design feature 4410 with assist features 4411 and 4412 as in FIG. 4C are obtained and are tilted as shown in FIG. 5D (CD as the vertical axis and focus as the horizontal axis). This effect on Bossung curves by the assist features have been observed both theoretically and experimentally. Therefore, optimizing the source (as manifested in the illumination pupil), the assist features, or both can be a useful tool to reduce the adverse effect caused by having non-zero incident angles associated with reflective patterning devices, thereby enlarging the process window.

Figure 5E:
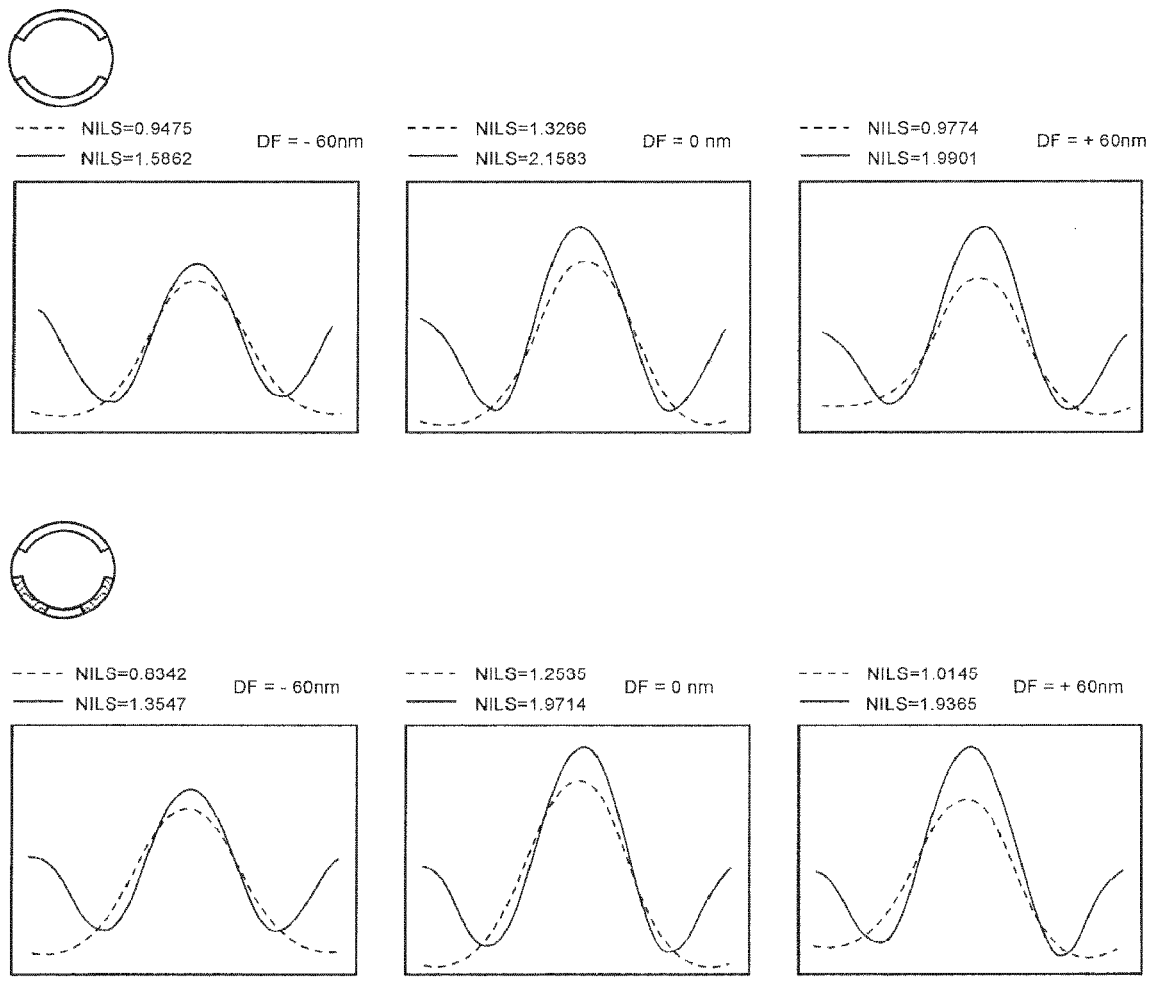
FIG. 5E shows the effect of assist features on contrast loss.

FIG. 5E shows the effect of assist features on contrast loss. In each of the panels in FIG. 5E, the solid line is an aerial image of a design feature (64 nm pitch lines) with symmetrical assist features; the dotted line is an aerial image of the same design feature without any assist features. The upper three panels show aerial images under illumination of a symmetrical dipole illumination pupil. The lower three panels show aerial images under illumination of an asymmetrical dipole illumination pupil. The existence of assist feature increase the NILS values at multiple defocus values. Higher NILS values indicate lower contrast loss.

Figure 6A:
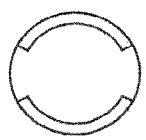
FIGS. 6A, 6B, 6C, 6D and 6E illustrate that the root cause of the tilt of Bossung curves (which manifest PDE and best focus shift) includes the reflective patterning device and the non-zero angle of incidence of the radiation on the patterning device.
Figure 6B:
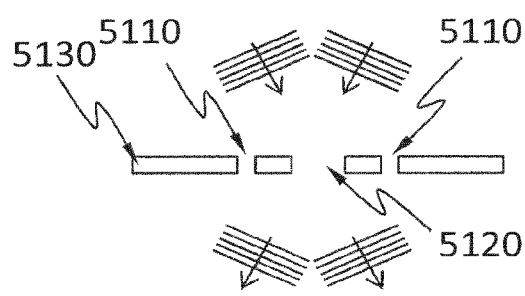
Figure 6D:
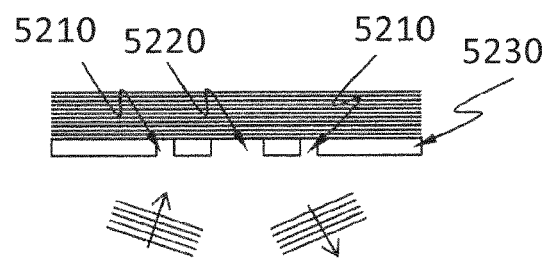
Figure 6C:
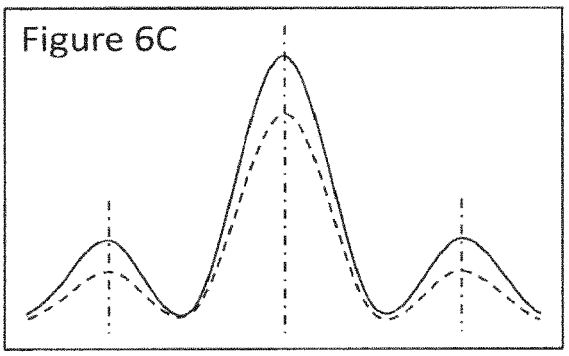
Figure 6E:
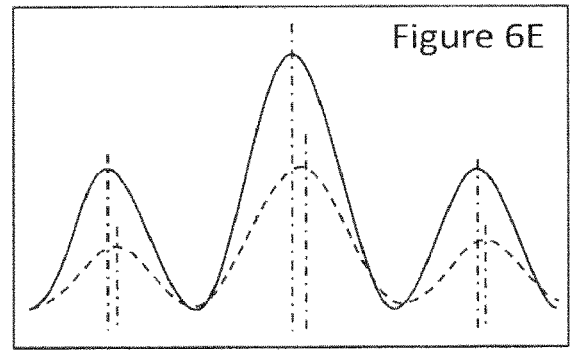

FIGS. 6A-6E illustrate that the root cause of the tilt of Bossung curves (which manifest PDE and best focus shift) includes the reflective patterning device and the non-zero angle of incidence of the radiation on the patterning device. FIG. 6A shows that the source used for the calculation in FIGS. 6B-6E is a symmetrical dipole source. FIG. 6B schematically shows a transmissive patterning device with a design feature 5120 and two symmetrically positioned assist features 5110. FIG. 6D schematically shows a reflective patterning device with a design feature 5220 and two symmetrically positioned assist features 5210. FIG. 6C shows an aerial image (solid line) of the patterning device of FIG. 6B simulated with the thickness of the absorbing material 5130 on the patterning device of FIG. 6B assumed to be zero, and an aerial image (dotted line) of the patterning device of FIG. 6B simulated with the electromagnetic effects of the non-zero thickness of the absorbing material 5130 taken into account. FIG. 6C shows that the position of the aerial image of the design feature 5110 remains the same regardless whether the electromagnetic effects of the non-zero thickness of the absorbing material 5130 is taken into account in the simulation, i.e., there is no PDE. In contrast, FIG. 6E shows an aerial image (solid line) of the patterning device of FIG. 6D simulated with the thickness of the absorbing material 5230 assumed to be zero, and an aerial image (dotted line) of the patterning device of FIG. 6D simulated with the thickness of the absorbing material 5230 taken into account. FIG. 6E shows that the position of the aerial image of the design feature 5220 depends on whether the electromagnetic effect of the non-zero thickness of the absorbing material 5230 is taken into account in the simulation.

FIGS. 7A-7D show that assist features can affect the symmetry of the Bossung curves because assist features cause phase shift between zero order diffraction and higher order diffraction. Bossung curves (CD as the vertical axis and focus as the horizontal axis), in FIGS. 7B and 7C of a pattern shown in FIG. 7A with a design feature with two symmetric assist features are obtained by simulation with the thickness of the absorbing material on the patterning device assumed to be zero. The simulation for the Bossung curve in FIG. 7B is under the condition of no phase shift between the zero order diffraction and the higher order diffraction. The simulation for the Bossung curve in FIG. 7C is under the condition of a 30 degree phase shift between the zero order diffraction and the higher order diffraction (the 30 degree phase shift is artificially added to the simulation). The Bossung curves of FIG. 7C are very similar to those of FIG. 5D (Bossung curves simulated with the electromagnetic effect of the non-zero thickness of the absorbing material on the patterning device taken into account, under the condition of no phase shift between the zero order diffraction and the first order diffraction). This similarity suggests that the reason that assist features can affect the symmetry of the Bossung curves is that assist features cause phase shift between zero order diffraction and higher order diffraction. FIG. 7D (dose as the vertical axis and focus as the horizontal axis) shows that the best focus of the pattern of FIG. 7A depends on the tilt of the Bossung curves.

Figure 8:
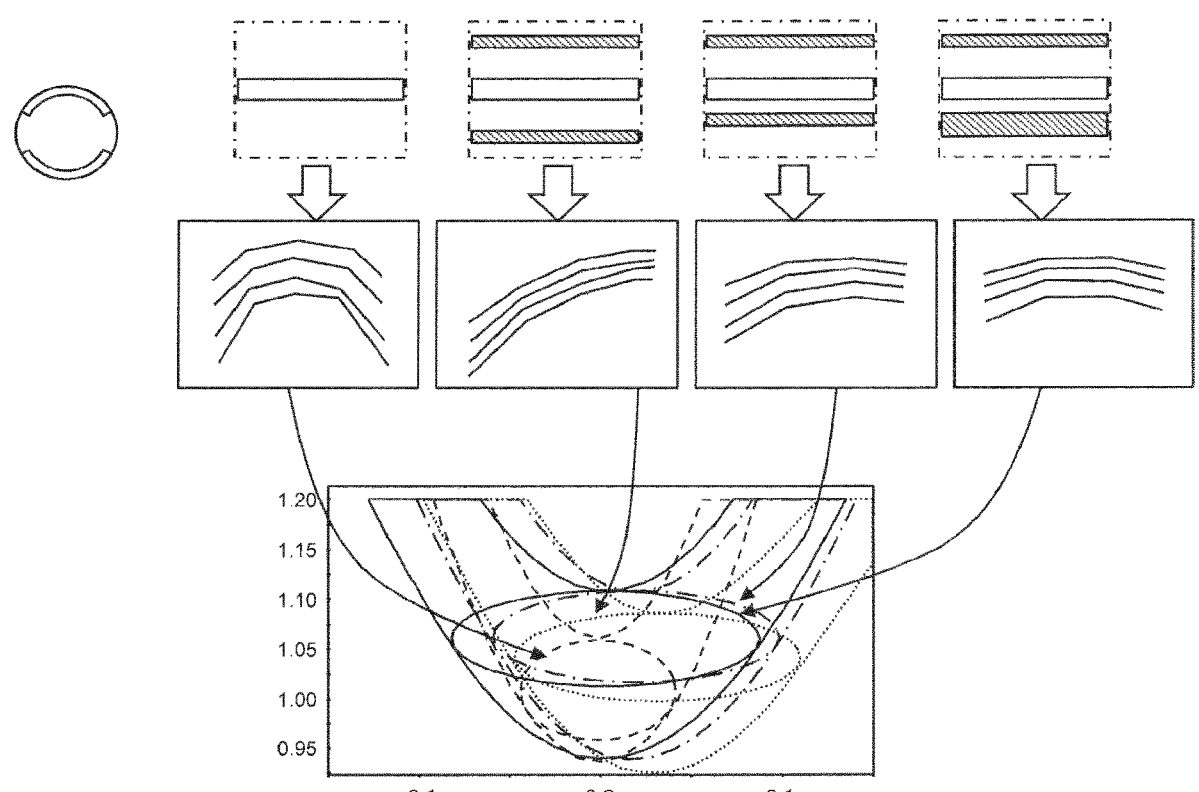
FIG. 8 shows that the shapes and positions of assist features affect the tilt of the Bossung curves.

FIG. 8 (dose as the vertical axis and focus as the horizontal axis) shows that the shapes and positions of assist features affect the tilt of the Bossung curves. Bossung curves of four patterns with an identical design feature and four different sets of assist features are simulated using a symmetrical dipole source. The four sets of assist features are, from left to right: no assist feature, two symmetrically positioned assist features with identical shape, two asymmetrically positioned assist features with identical shape, and two assist features that are both asymmetrically positioned and with different shapes. In this particular example, assist features that are both asymmetrically positioned and with different shapes result in the most symmetrical Bossung curves and a largest and symmetrically positioned process window.

Figure 9A:
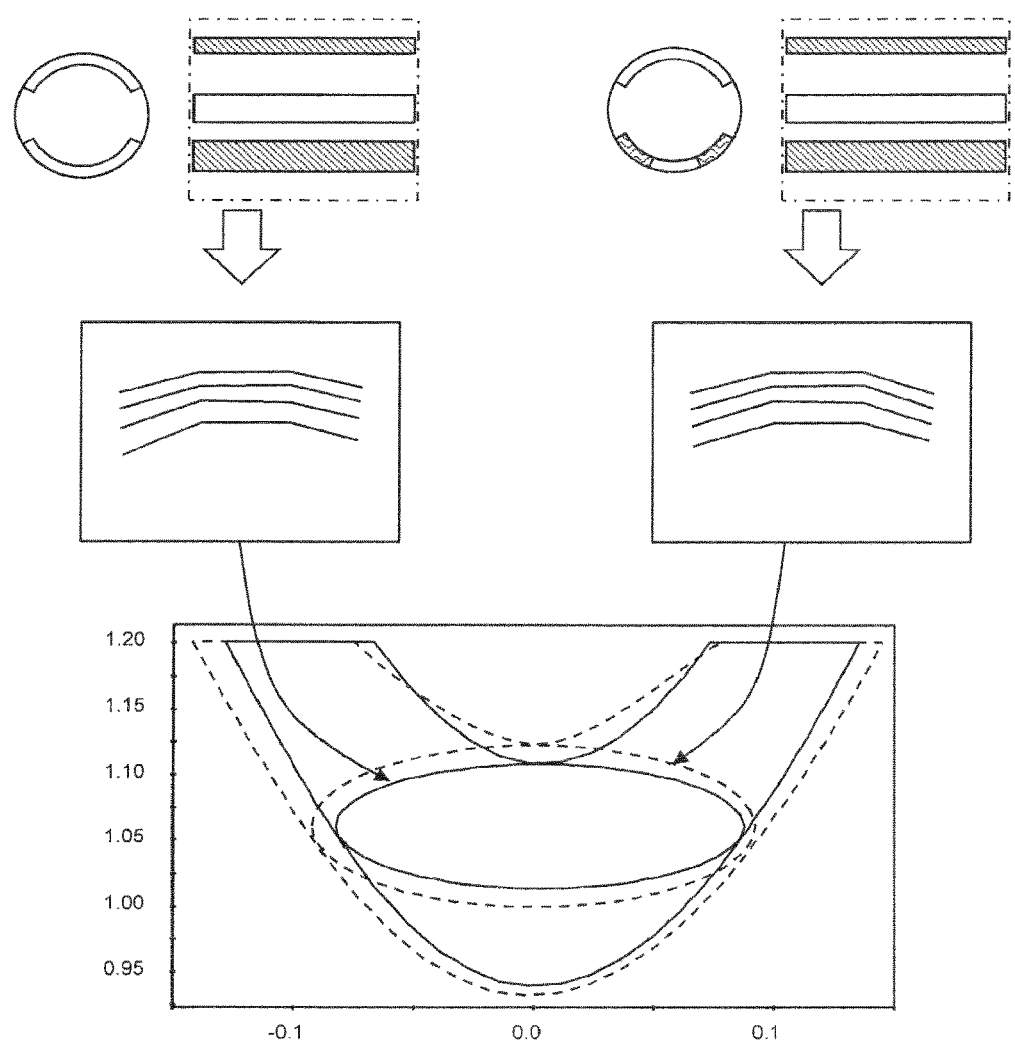
FIG. 9A shows a combined effect on the Bossung curves of asymmetrical assist features and asymmetrical illumination pupil.
Figure 9B:
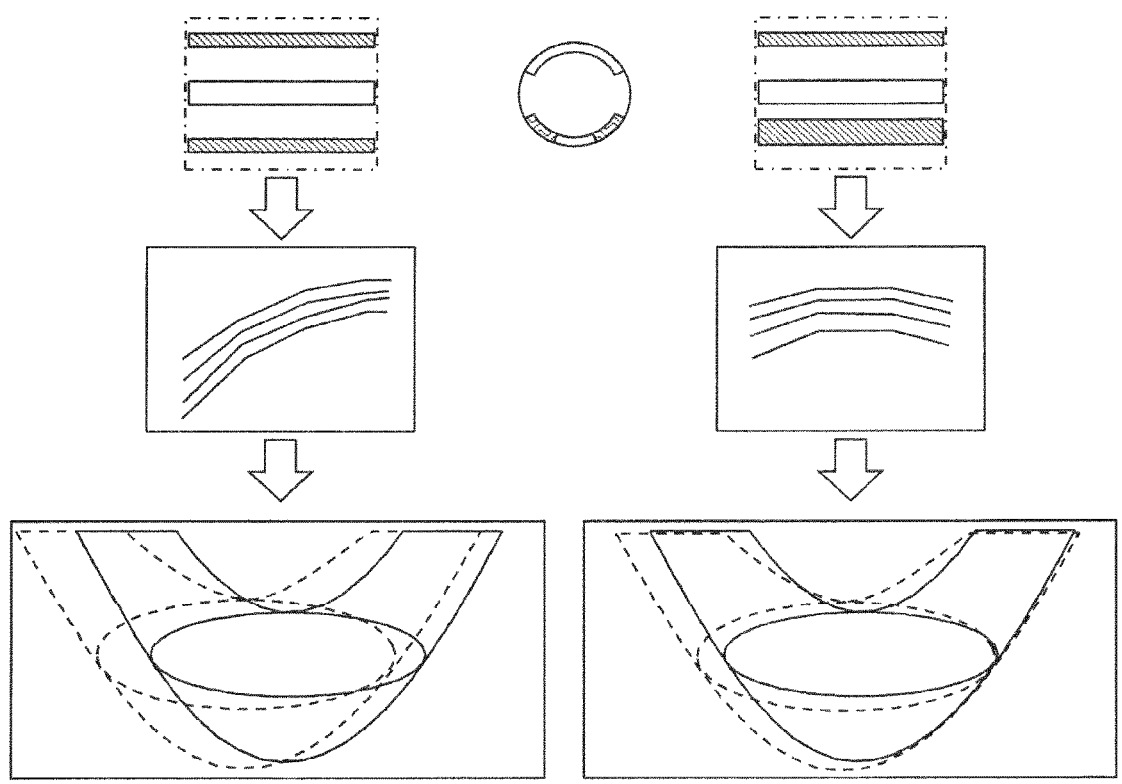
FIG. 9B shows the effect on the best focus shift of asymmetrical assist features.

FIG. 9A shows a combined effect on the Bossung curves of asymmetrical assist features and asymmetrical source. Bossung curves of a design feature with two assist features that are both asymmetrically positioned and with different shapes are simulated, respectively using a symmetrical source (left) and an asymmetrical source (right). The asymmetrical source results in a larger process window. FIG. 9B shows the effect on the best focus shift of asymmetrical assist features. The best focuses (i.e., centers of process windows) for two different patterns are simulated using an asymmetrical source and symmetrical assist features (left), and using an asymmetrical source and asymmetrical assist features (right). The asymmetrical assist features result in smaller best focus shift (i.e., more overlap of the process windows for the two different patterns).

Figure 10:
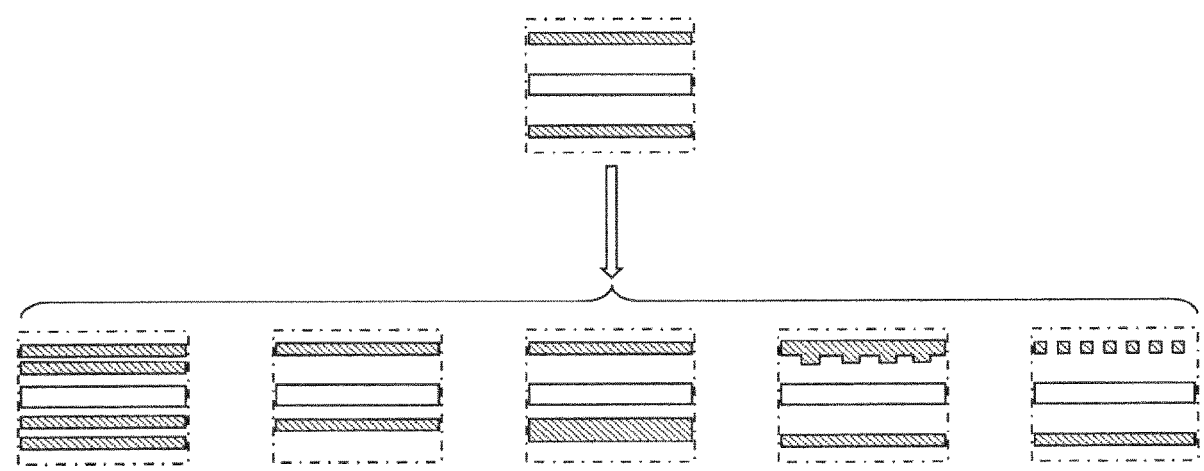
FIG. 10 shows several assist feature configurations with different positions, shapes, numbers, transmission and phase that may be suitable.

The shapes of assist features that may be used to affect tilt of the Bossung curves are not limited to bars with various widths. FIG. 10 shows several assist feature configurations with different positions, shapes, numbers, transmission and phase that may be suitable. For example, the assist features are not necessarily a rectangle. They may have any complex shapes as needed. One particular example is the so-called halftone assist features, which are essentially a dotted line with a finite width (the rightmost example in FIG. 10). Another example is phase-shifting assist features.

So far, the disclosure has shown that the source, shapes of assist features, positions of assist features, number of assist features, or a combination selected from the foregoing, may be used to affect the tilt of Bossung curves, i.e., affect PDE, contrast loss, best focus shift and the process window. The design layout may not initially include assist features because their positions and shapes may depend on the specific lithographic apparatus and process to be used to image the design layout. Assist features may be added into a design layout. The initial positions and shapes of the assist features may be determined by a set of rules. These rules may designate the initial positions and shapes based on many factors, such as characteristics of the design layout, characteristics of the lithographic apparatus and process, etc. Once the initial positions and shapes of the assist features are determined, they can be further adjusted or optimized.

Figure 11A:
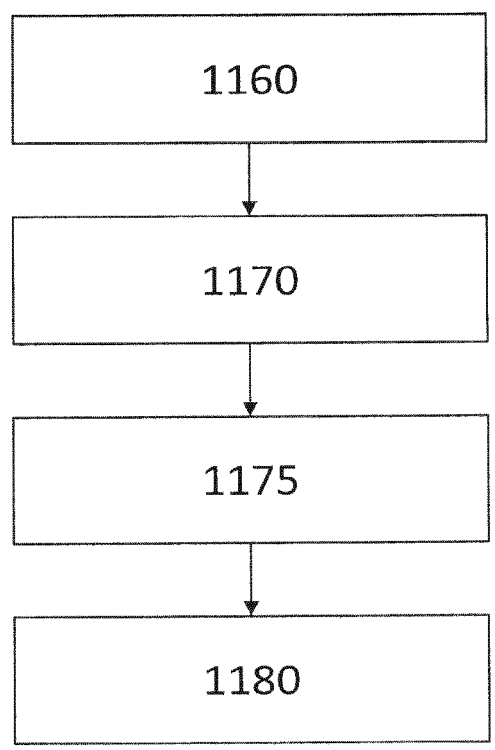
FIG. 11A shows a flow chart for a method of determining characteristics of assist features (e.g., shapes, number, positions, transmission, phase)

FIG. 11A shows a flow chart for a method of determining characteristics of assist features (e.g., shapes, number, positions, transmission, phase, relative position to a pair of edge, relative position to center line between a pair edges, or relative position to any reference point on the design layout). The positions may be relative positions to a design feature (e.g., a distance to one edge of a pair of edges). The shapes may be a width of the assist features. In optional step 1160, the source is adjusted, thereby reducing pattern shift, contrast loss, and/or tilt of Bossung curves. In step 1170, the characteristics of the assist features or of a data structure representing the assist features are determined using one or more rules. In optional step 1175, the characteristics of the assist features of a data structure representing the assist features may be adjusted using a model. For example, the assist features may be co-optimized with the one or more design features, one or more parameters of the patterning process (e.g., focus, dose, mask bias), one or more parameters of the lithographic apparatus, or a combination selected from the foregoing. This model-based adjustment may include simulating an image produced by the design and assist features in accordance with a patterning process, and computing a cost function representing deviation of the image. In optional step 1180, the assist features with the determined characteristics are placed onto a patterning device; or the data structure representing the assist features is placed into a data structure representing a portion of the design layout. A patterning device may be configured or manufactured to represent the data structure representing the assist features. The assist features may be placed between a pair of edges. The assist features may be asymmetrical with respect to the pair of edges (e.g., having different width, distance to the edges, different shape, different transmission, different phase, or a combination selected from the foregoing). The assist features may be further adjusted so as to meet a requirement of manufacturability. For example, the assist features 1350, 1360 and 1370 in FIG. 13 may be slightly shortened.

Figure 11B:
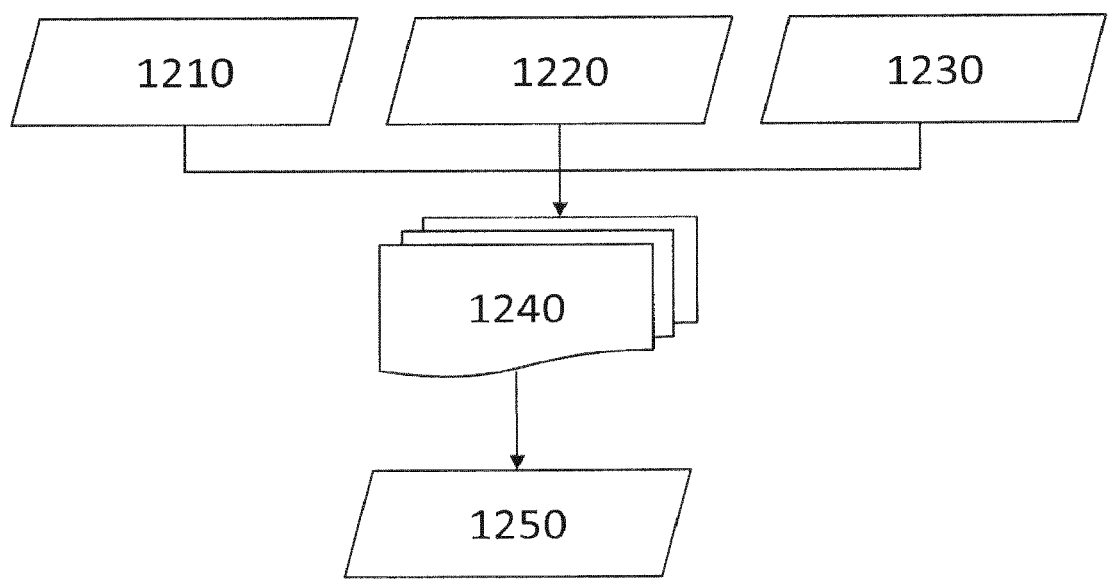
FIG. 11B shows a flow chart for an implementation of step 1170 of FIG. 11A.

FIG. 11B shows a flow chart for an implementation of step 1170 of FIG. 11A. The rules 1240 may determine the characteristics 1250 of the assist features using many parameters. For example, these parameters may include spacings 1210 of pairs of edges of design features in a design layout, orientations 1220 of pairs of edges of design features from design layout, and possibly other parameters 1230 such as slit position of design features, sizes of design features, locations of design features, etc. For example, the rules 1240 may determine a distance between the assist features and one of the pair of edges based on a spacing between the pair of edges. "Slit position" of a design feature means the position of the slit of the lithographic apparatus where light from that position images the design feature to the substrate. The term "pair of edges" as used herein means two portions of edges of the design features in the design layout that are parallel, have the same length, and any straight line connecting which and perpendicular to which does not pass any other edges of any design feature of the design layout.

Figure 11C:
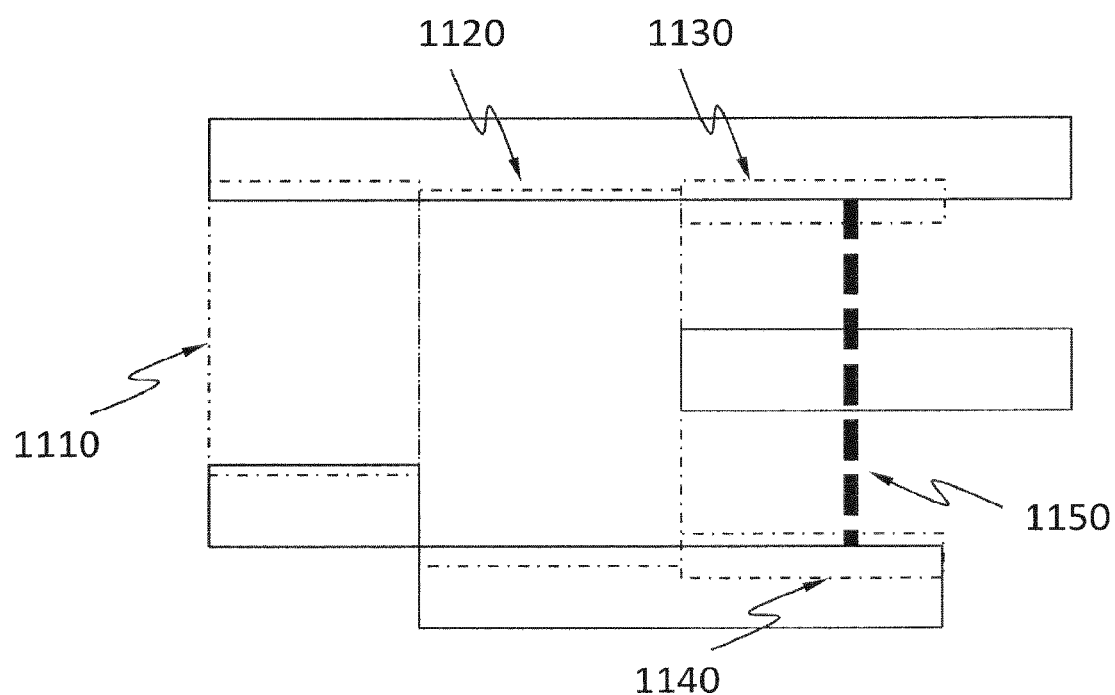
FIG. 11C shows an example to elucidate the term "pair of edges"

FIG. 11C shows an example to elucidate the term "pair of edges." In FIG. 11C, four design features (solid-lined boxes) are shown. Dotted boxes 1110 and 1120 each enclose a pair of edges. Edge 1130 and edge 1140 are not a pair of edges because there exists a straight line 1150 connecting edges 1130 and 1140 and perpendicular thereto passes another design feature. The edges in a pair of edges may extend along any direction. The edges in a pair of edges may be edges of the same design feature as long as the definition above is met.

The model-based adjustment of the characteristics of the assist features of a data structure representing the assist features following the rule-based determination in step 1170 can further improve the patterning process and be less computationally expensive than a full model-based determination of the characteristics of the assist features of a data structure representing the assist features. That is the model can take the results of the rule-based determination in step 1170 and application of those results to the model can arrive at an adjustment of one or more characteristics (e.g., adjustment of position, width or both) of the assist features of a data structure representing the assist features. Additionally or alternatively, a model can take the results of the rule-based determination in step 1170 and application of those results to the model can arrive at an arrive at an adjustment of one or more processing parameters of the patterning process to a value of a processing parameter closer to a desired value of the processing parameter (wherein, e.g., one or more characteristics of one or more assist features are used with the model).

For example, the rule-based determined assist features may be co-optimized with one or more of the design features, one or more parameters of the patterning process (e.g., focus, dose, mask bias), one or more parameters of the lithographic apparatus, or a combination selected from the foregoing. As another example, one or more parameters of the patterning process (e.g., focus, dose, mask bias, etc.) may be co-optimized with the rule-based determined assist features, one or more of the design features, one or more parameters of the lithographic apparatus (e.g., mask bias where the co-optimized patterning process parameter comprises dose, focus, etc.), or a combination selected from the foregoing. This model-based adjustment may include simulating an image produced with a patterning process by the design and assist features, and computing a cost function representing, e.g., deviation of the image. The cost function may focus minimization/maximization of one or a combination of parameters, such as dose variation, depth of focus (e.g., maximize), MEEF (e.g., minimize), range of MEEF (e.g., minimize), and/or edge placement error (EPE). In an example, a cost function may have one or more penalties, such as a dark to bright transition penalty, an illumination source specification (e.g., a limit on angular/spatial intensity distribution, etc.) penalty, an undesired pattern feature printing penalty, an undesired assist feature printing penalty, and/or an assist feature manufacturability penalty. For example, the cost function may minimize EPE within a process variation band determined by defocus, dose and patterning device CD.

Table 1 shows an example demonstrating the improvement by this additional model-based adjustment. As the data in Table 1 show, the step 1175 reduces MEEF and increases the depth of focus from those obtained by assist features as determined in step 1170.

TABLE 1

| | No Assist Features | Symmetric Assist Features Determined Only by Rules | Asymmetric Assist Features Determined Only by Rules | Asymmetric Assist Features Determined by Rules and Adjusted by a Model | Asymmetric Assist Features Determined Only by a Model |
|---|---|---|---|---|---|
| MEEF of a outline "CL_3" | 1.92 | 2.39 | 2.49 | 2.13 | 2.2 |
| MEEF range (all outlines) | (1.74, 2.3) | (2.16, 2.51) | (2.14, 2.77) | (2.02, 2.45) | (2.07, 2.43) |
| DOF@10% EL | 54 nm | 54 nm | 82 nm | 99 nm | 97 nm |
| DOF@12% EL | N/A | N/A | N/A | 81 nm | 61 nm |

MEEF or Mask Error Enhancement Factor describes the relation between changes in the pattern on the design layout and changes in the corresponding pattern imaged onto the substrate. MEEF can be mathematically expressed as $$MEEF = \frac{\partial CD_{substrate}}{\partial (CD_{design\ layout}/M)},$$

where M is the reduction ratio of the lithography apparatus.

Figure 12:
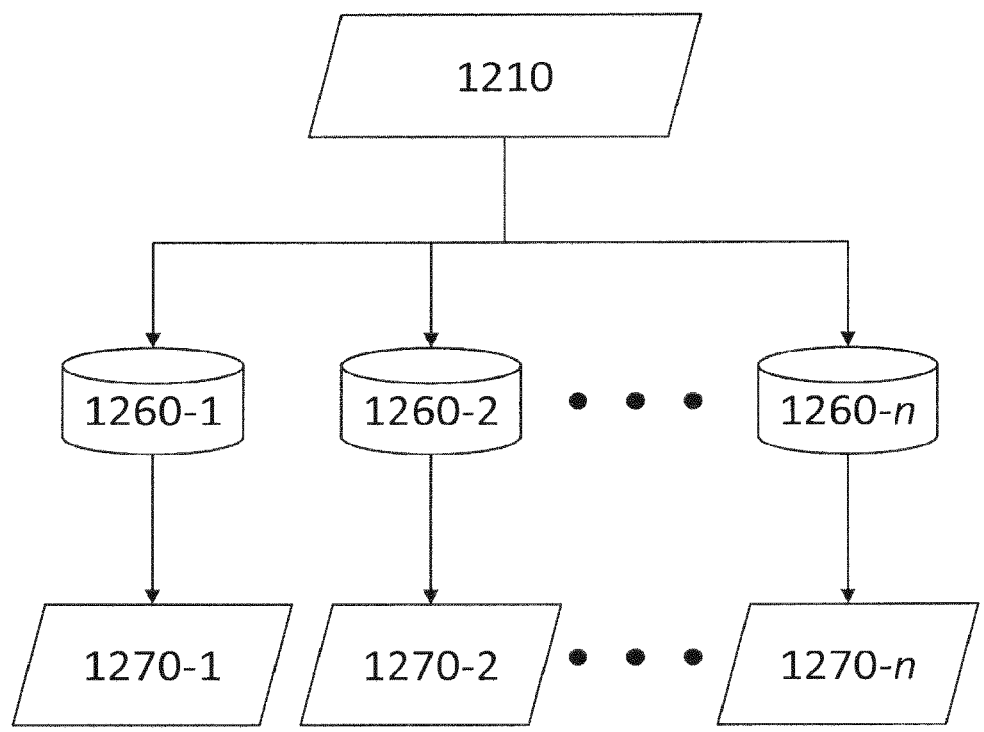
FIG. 12 shows an example of the rules 1240 in FIG. 11B.

FIG. 12 shows an example of the rules 1240. Characteristics of assist features may be determined by binning a spacing 1210 of a pair of edges into one of a plurality of bins 1260-1, 1260-2, ..., 1260-n. Each bin has a separate rule for determining the characteristics of the assist features. Therefore, the characteristics 1270-1, 1270-2, ... 1270-n are determined according to the result of binning the spacing. In an example, there are three bins (0, HCS1], (HCS1, HCS2], and (HCS2, ∞). If the spacing 1210 falls into the bin of (0, HCS1], no assist feature is to be placed on the design layout; if the spacing 1210 falls into the bin of (HCS1, HCS2], one assist feature is to be placed between the pair of edges; if the spacing 1210 falls into the bin of (HCS2, ∞), two assist features are to be placed between the pair of edges. HCS1 and HCS2 are two positive values and HCS2 is greater than HCS1. Binning the spacing 1210 is just one example and is not the only way to determine characteristics of assist features.

Figure 13:
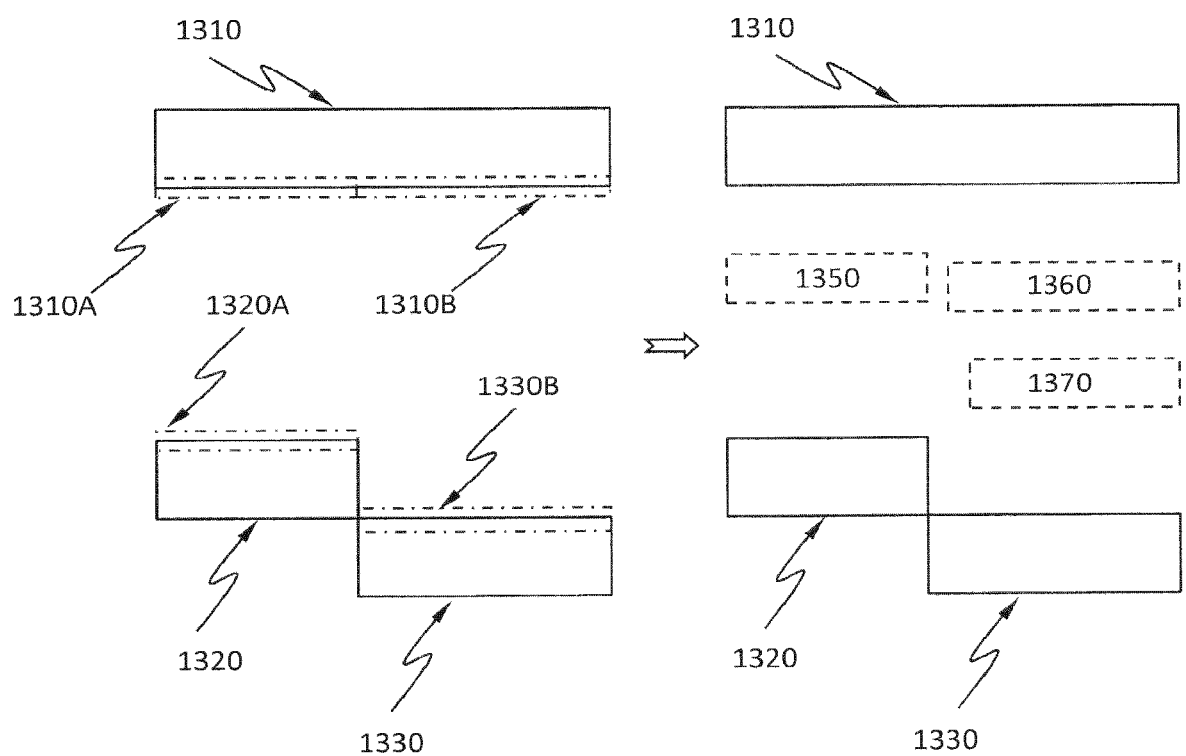
FIG. 13 shows an example of three design features to further elucidate the workings of the example in FIG. 12.

FIG. 13 shows an example of three design features 1310, 1320, and 1330 to further elucidate the workings of the example in FIG. 12. There are two pairs of edges. Edge 1310A of design feature 1310 and edge 1320A of design feature 1320 constitute one pair. Edge 1310B of design feature 1310 and edge 1330B of design feature 1330 constitute another pair. The spacing of the pair of edges 1310A and 1320A falls into the bin of (HCS1, HCS2]; the spacing of the pair of edges 1310B and 1330B falls into the bin of (HCS2, ∞). Therefore, the rules determine that one assist feature 1350 is to be placed between edges 1310A and 1320A, and two assist features 1360 and 1370 are to be placed between edges 1310B and 1330B.

Figure 14A:
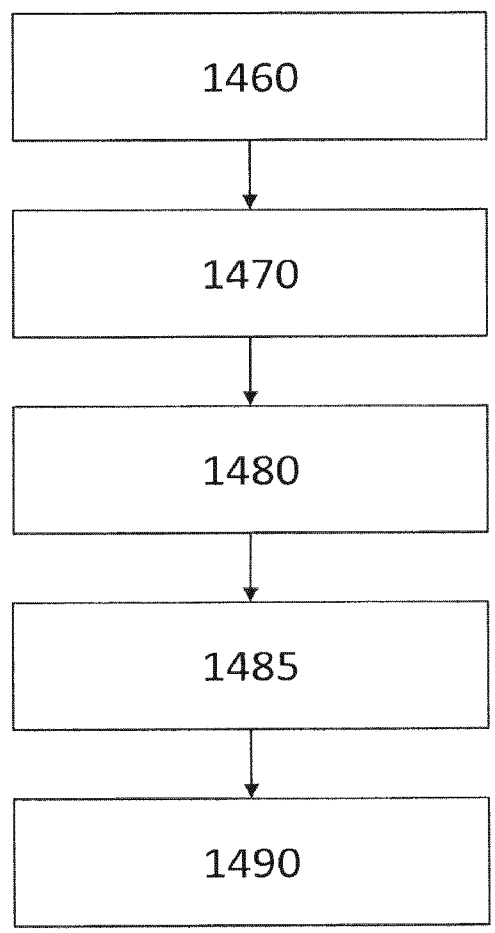
FIG. 14A shows a flow chart for a method of adjusting characteristics of assist features (e.g., shapes, number, positions, transmission, phase)

FIG. 14A shows a flow chart for a method of adjusting characteristics of assist features (e.g., shapes, number, positions, transmission, phase, relative position to a pair of edge, relative position to center line between a pair edges, or relative position to any reference point on the design layout). In optional step 1460, the source is adjusted, thereby reducing pattern shift, contrast loss, and/or tilt of Bossung curves. In optional step 1470, the characteristics of the assist features or of a data structure representing the assist features are determined using one or more first rules. In step 1480, the characteristics of the assist features or of a data structure representing the assist features are adjusted using one or more second rules. In optional step 1485, the characteristics of the assist features of a data structure representing the assist features may be adjusted using a model. For example, the assist features may be co-optimized with one or more of the design features, one or more parameters of the patterning process (e.g., focus, dose, mask bias), one or more parameters of the lithographic apparatus, or a combination selected from the foregoing. This model-based adjustment may include simulating an image produced with a patterning process by the design and assist features, and computing a cost function representing deviation of the image. In optional step 1490, the assist features with the adjusted characteristics are placed onto the patterning device; or the data structure representing the assist features is placed into a data structure representing a portion of the design layout. A patterning device may be configured or manufactured to represent the data structure representing the assist features. The first rules may determine the characteristics of the assist features such that the assist features are to be symmetrically placed in a pair of edges. The second rules may adjust the assist features to reduce tilt Bossung curves, a result of which may be that the assist features cease to be symmetric in a pair of edges. The assist features may be asymmetrical with respect to the pair of edges (e.g., having different width, distance to the edges, different shape, different transmission, different phase, or a combination selected from the foregoing). The assist features may be further adjusted so as to meet a requirement of manufacturability. For example, the assist features 1650, 1660 and 1670 in FIG. 16 may be slightly shortened.

Figure 14B:
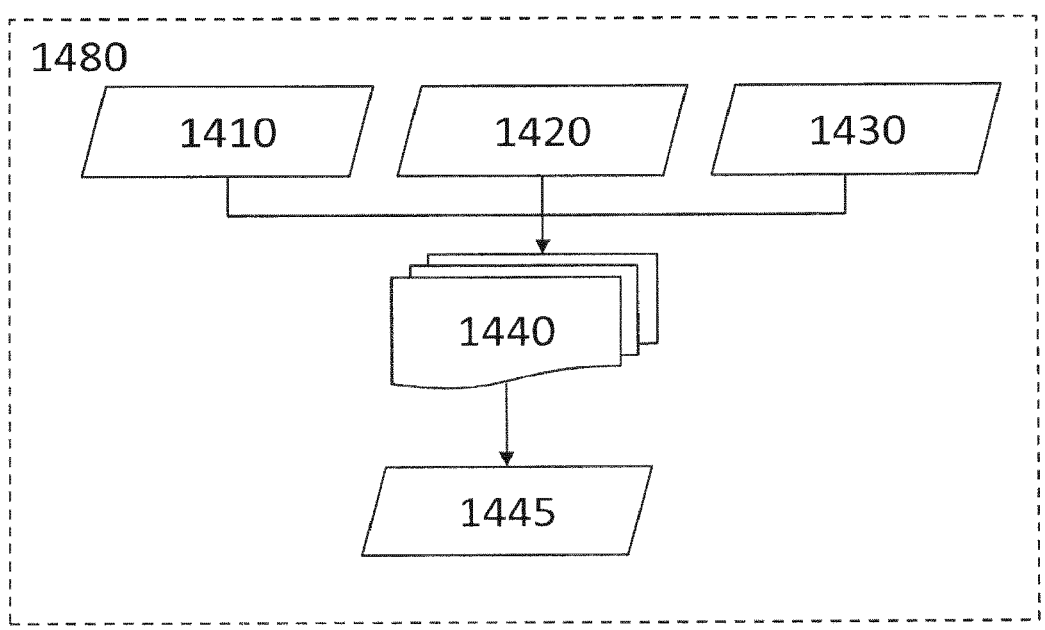
FIG. 14B shows a flow chart for an implementation of step 1480 of FIG. 14A.

FIG. 14B shows a flow chart for an implementation of step 1480 of FIG. 14A. The second rules 1440 may determine adjustments 1445 to the characteristics 1450 of the assist features using many parameters. For example, these parameters may include spacings 1410 of pairs of edges of design features in a design layout, orientations 1420 of pairs of edges of design features from design layout, and possibly other parameters 1430 such as slit position of design features, sizes of design features, locations of design features, etc. For example, the second rules 1440 may adjust a distance between the assist features and one of the pair of edges based on a spacing between the pair of edges.

Figure 15:
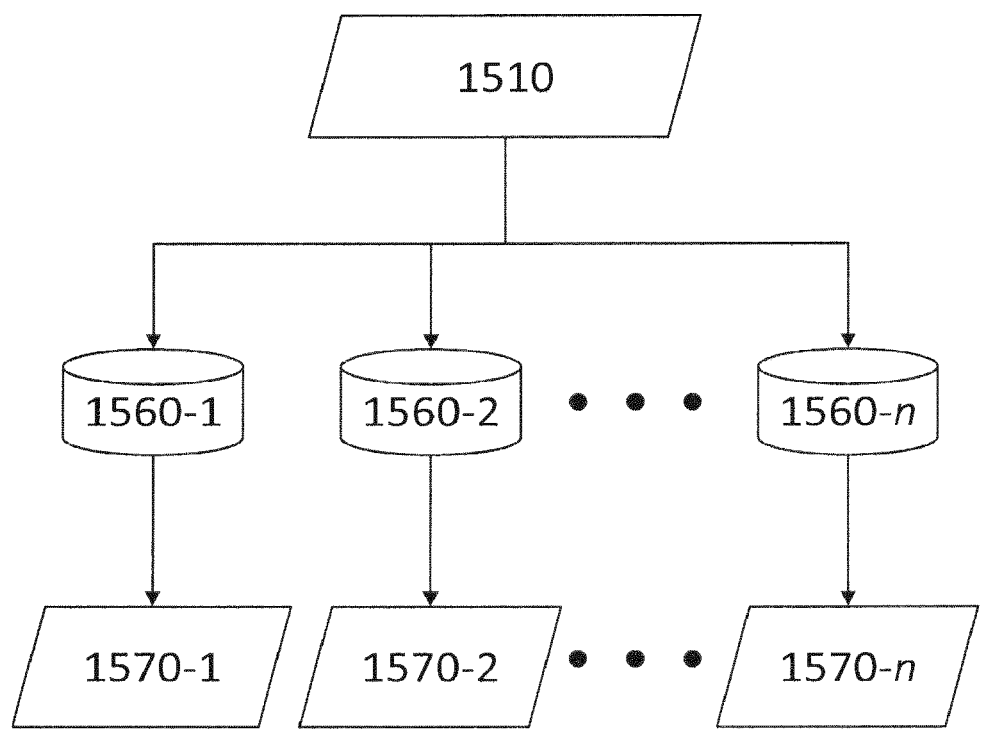
FIG. 15 shows an example of the rules 1440 in FIG. 14A.

FIG. 15 shows an example of the second rules 1440. Characteristics of assist features may be determined by binning a spacing 1410 of a pair of edges into one of a plurality of bins 1560-1, 1560-2, ..., 1560-n. Each bin has a separate rule for determining the adjustments to the characteristics of the assist features. Therefore, the adjustments 1570-1, 1570-2, ..., 1570-n are determined according to the result of binning the spacing. In an example, there are three bins (0, HCS1], (HCS1, HCS2], and (HCS2, ∞). If the spacing 1410 falls into the bin of (0, HCS1], no adjustment is necessary; if the spacing 1410 falls into the bin of (HCS1, HCS2], one assist feature is to be shifted toward one edge of the pair; if the spacing 1410 falls into the bin of (HCS2, ∞), two assist features are to be shifted independently relative to the pair of edges. HCS1 and HCS2 are two positive values and HCS2 is greater than HCS1. Binning the spacing 1410 is just one example and is not the only way to determine characteristics of assist features.

Figure 16:
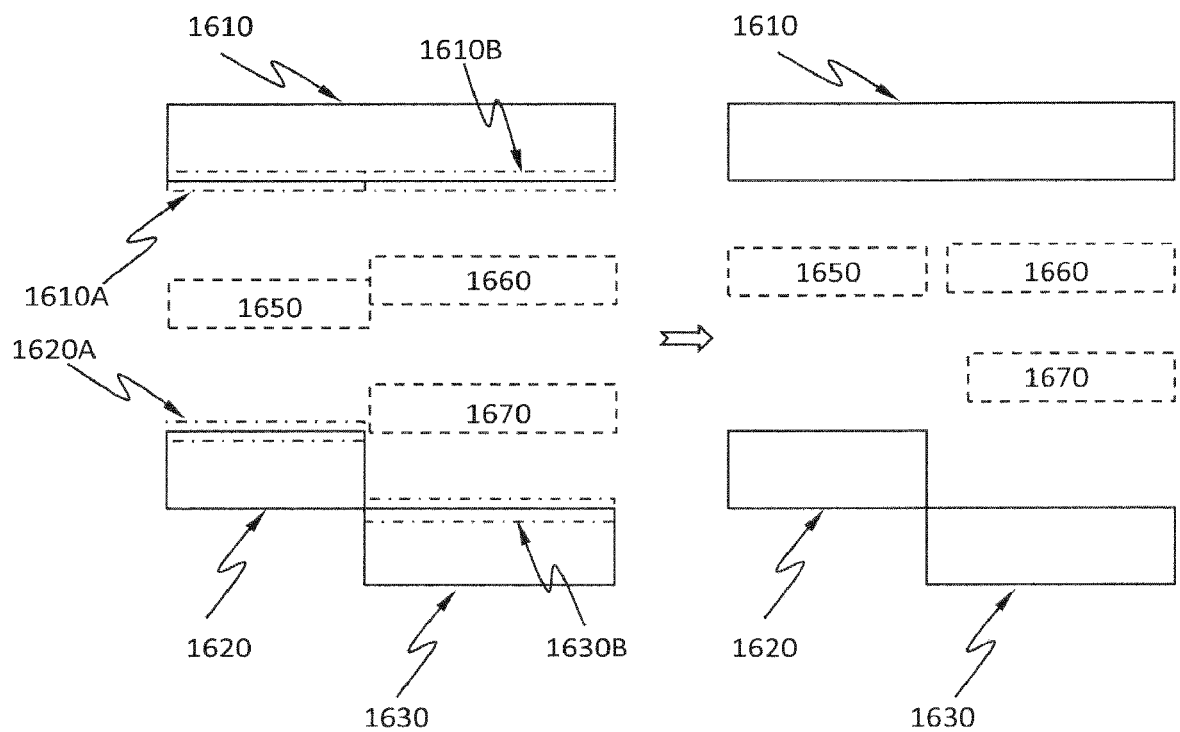
FIG. 16 shows an example of three design features to further elucidate the workings of the example in FIG. 15.

FIG. 16 shows an example of three design features 1610, 1620, and 1630 to further elucidate the workings of the example in FIG. 15. There are two pairs of edges. Edge 1610A of design feature 1610 and edge 1620A of design feature 1620 constitute one pair. Edge 1610B of design feature 1610 and edge 1630B of design feature 1630 constitute another pair. The first rules place a single assist feature 1650 symmetrically between (e.g., equally distant from) edges 1610A and 16020A, and place two assist features 1660 and 1670 symmetrically between (e.g., equally distant from) edges 1610B and 16030B. The spacing of the pair of edges 1610A and 1620A falls into the bin of (HCS1, HCS2]; the spacing of the pair of edges 1610B and 1630B falls into the bin of (HCS2, ∞). Therefore, the second rules adjust the assist feature 1650 by shifting it toward design feature 1610, and the assist features 1660 and 1670 by shifting both toward design feature 1610 but by different amounts. After the adjustments, the assist features 1650, 1660 and 1670 are no longer symmetrically positioned.

Figure 17:
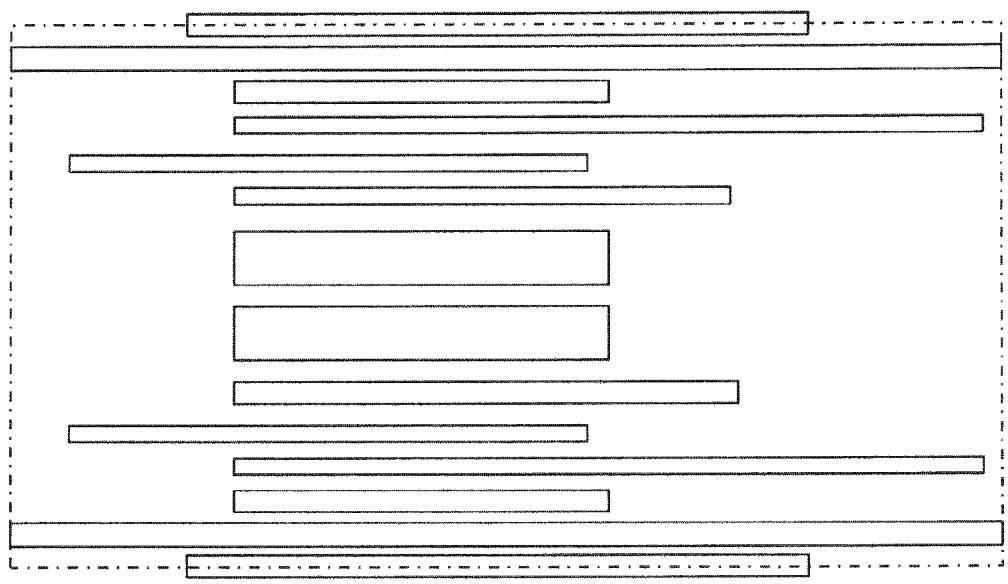
FIG. 17 shows a clip of a design layout.
Figure 18:
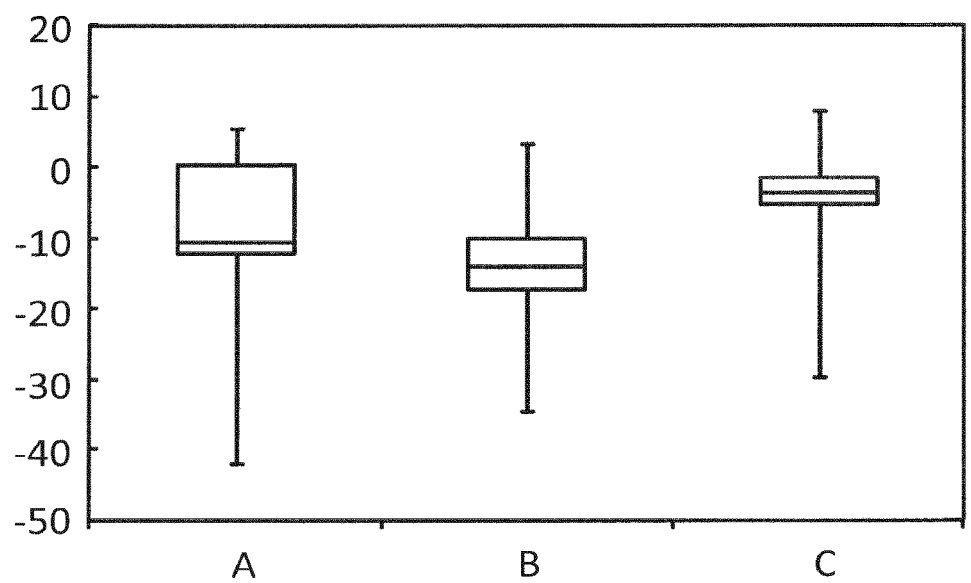
FIG. 18 demonstrates the effect of the method described in FIG. 11A, FIG. 11B and FIG. 12.

FIG. 17 shows an example clip of a design layout. The box whisker plot of FIG. 18 demonstrates the effect of the method described in FIG. 11A, FIG. 11B and FIG. 12. Specifically, FIG. 18 shows the distributions of best focus shift of the clip of FIG. 17. Column A shows the distribution without any assist features placed on the clip of FIG. 17. Column B shows the distribution with symmetric assist features placed on the clip of FIG. 17. Column C shows the distribution with assist features placed on to the clip of FIG. 17 according to the method described in FIG. 11A, FIG. 11B and FIG. 12. The vertical axis is the best focus shift in nanometer. The bars in each column are the maximum and minimum values of the best focus shift among the design features in the clip of FIG. 17. The box in each column shows the standard deviation of the values of the best focus shift of the design features in the clip of FIG. 17. The line in the box in each column shows the median of the values of the best focus shift of the design features in the clip of FIG. 17. The method described in FIG. 11A, FIG. 11B and FIG. 12 leads to the best result as manifested by the smallest first to third quartile range.

The rules as described herein may be organized into a database or a table. For example, the rules may determine values of a characteristic of an assist feature at a plurality of discrete values of a parameter (e.g., slit position of a design feature). If the actual value of the parameter is not exactly one of these discrete values, the characteristic of the assist feature may be obtained by interpolation or extrapolation.

Figure 19:
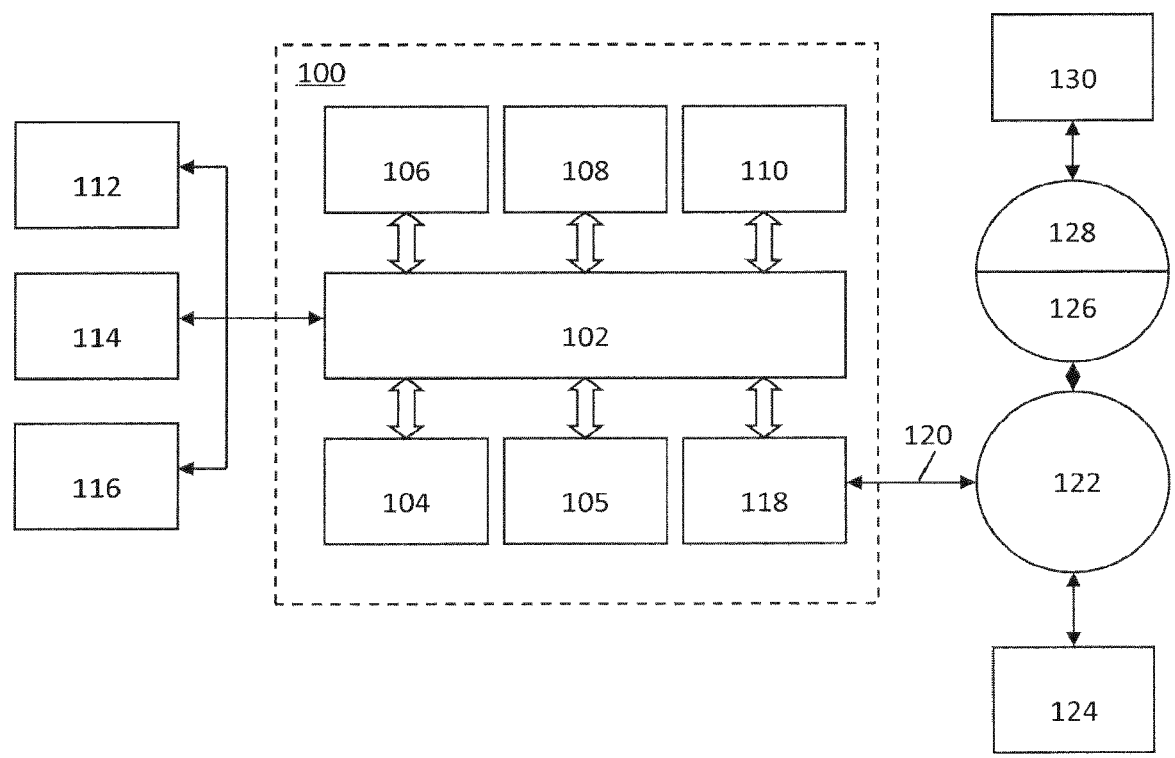
FIG. 19 is a block diagram of an example computer system in which embodiments can be implemented.

FIG. 19 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Volatile and non-volatile media may be considered non-transitory media. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 20:
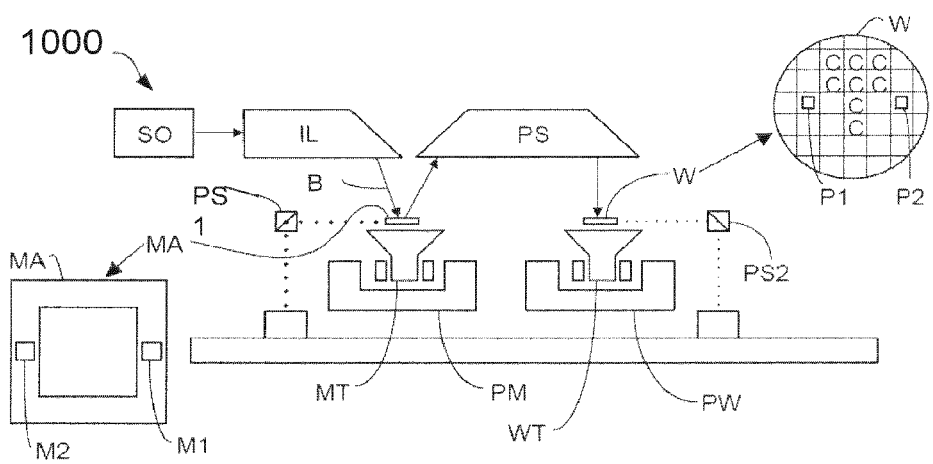
FIG. 20 is a schematic diagram of another lithographic apparatus.

FIG. 20 schematically depicts another lithographic apparatus 1000 whose illumination source could be optimized utilizing the methods described herein.

The lithographic apparatus 1000 includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 20, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 20, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 21:
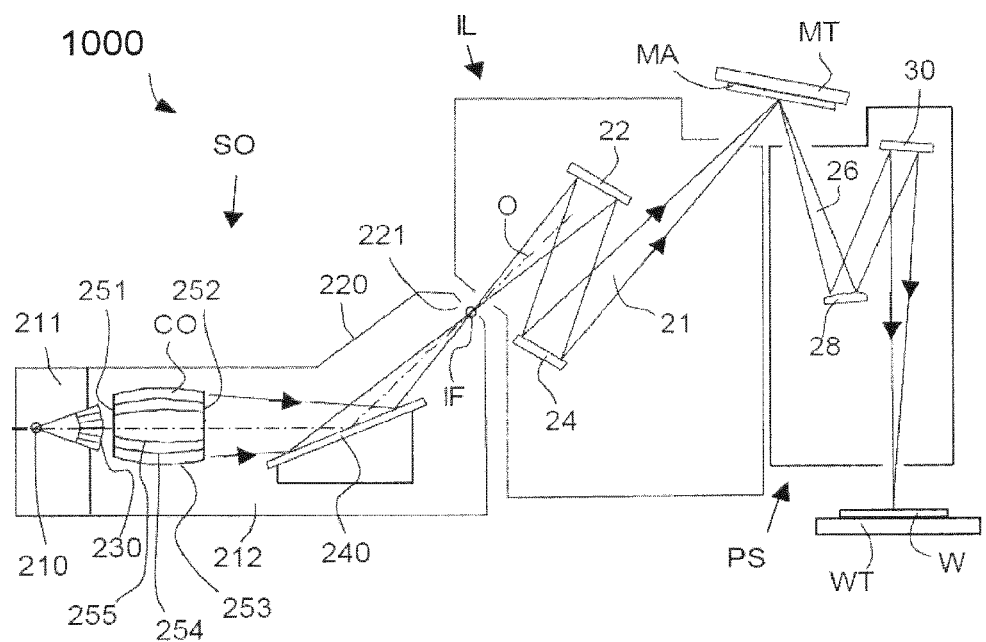
FIG. 21 is a more detailed view of the apparatus in FIG. 20.

FIG. 21 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 21.

Collector optic CO, as illustrated in FIG. 21, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 22:
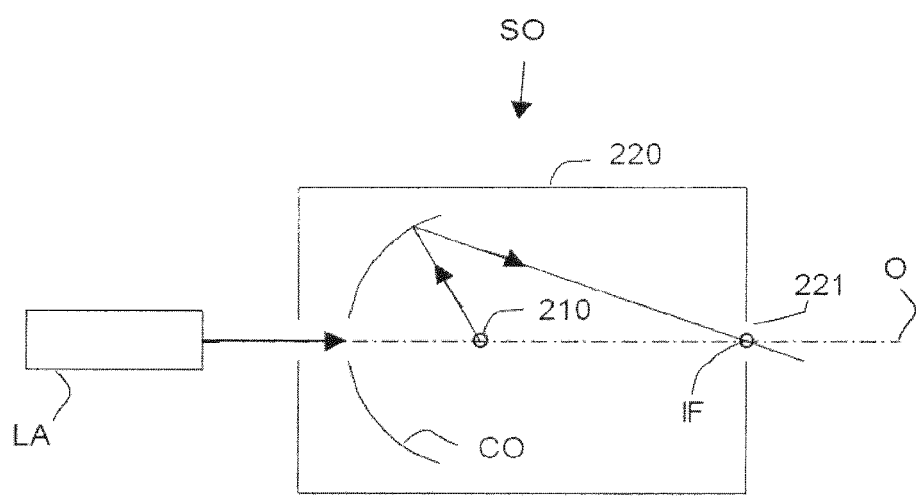
FIG. 22 is a more detailed view of the source collector module SO of the apparatus of FIG. 20 and FIG. 21.

Alternatively, the source collector module SO may be part of an LPP radiation system as shown in FIG. 22. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

According to an embodiment, a computer-implemented method to improve a patterning process for imaging a portion of a design layout onto a substrate using a lithographic apparatus, comprises: obtaining one or more rules that determine one or more characteristics of one or more assist features based on one or more parameters selected from a group consisting of one or more characteristics of one or more design features in the portion, one or more characteristics of the patterning process, one or more characteristics of the lithographic apparatus, and a combination thereof; optionally determining the one or more characteristics of the one or more assist features using the one or more rules; wherein the one or more parameters optionally comprise a spacing between a pair of edges, and wherein the one or more rules are configured to generate a predefined distance between the assist feature and one of the pair of edges for a range of space values between the pair of edges to obtain an asymmetric arrangement of the assist feature between the two edges; placing the one or more assist features onto the patterning device.

According to an embodiment, a computer-implemented method to improve a patterning process for imaging a portion of a design layout onto a substrate using a lithographic apparatus, comprises: obtaining one or more rules applicable to a data structure representing the portion of the design layout, the one or more rules being configured to determine one or more characteristics of a further data structure representing one or more assist features based on one or more parameters selected from a group consisting of one or more characteristics of one or more design features in the portion, one or more characteristics of the patterning process, one or more characteristics of the lithographic apparatus, and a combination thereof; determining the one or more characteristics of the further data structure representing the one or more assist features using the one or more rules; wherein the one or more parameters comprise a spacing between a pair of edges in the data structure representing the portion of the design layout, and wherein the one or more rules are configured to generate a predefined distance between the assist feature and one of the pair of edges for a range of space values between the pair of edges to obtain an asymmetric arrangement of the assist feature between the two edges; placing the further data structure representing the one or more assist features onto the data structure representing the portion of the design layout.

According to an embodiment, a computer-implemented method to improve a patterning process for imaging a portion of a design layout onto a substrate using a lithographic apparatus, comprises: obtaining one or more rules that determine one or more characteristics of one or more assist features based on one or more parameters selected from a group consisting of: one or more characteristics of one or more design features in the portion, one or more characteristics of the patterning process, one or more characteristics of the lithographic apparatus, and/or a combination selected from the foregoing; determining the one or more characteristics of the one or more assist features using the one or more rules; wherein the one or more parameters comprise a spacing between a pair of facing edges; placing the one or more assist features onto the design layout; wherein the one or more assist features are asymmetrical with respect to the pair of facing edges.

According to an embodiment, a computer-implemented method to improve a patterning process for imaging a portion of a design layout onto a substrate using a lithographic apparatus, the portion comprising one or more assist features, comprises: obtaining one or more rules that adjust one or more characteristics of the assist features based on one or more parameters selected from a group consisting of: one or more characteristics of one or more design features in the portion, one or more characteristics of the patterning process, one or more characteristics of the lithographic apparatus, and/o a combination selected from the foregoing; adjusting the one or more characteristics of the assist features using the one or more rules; wherein the one or more parameters comprise a spacing between a pair of facing edges; placing the one or more assist features onto the design layout; wherein the one or more assist features are asymmetrical with respect to the pair of facing edges.

According to an embodiment, a computer-implemented method to improve a patterning process for imaging a portion of a design layout onto a substrate using a lithographic apparatus, comprises: obtaining one or more rules that determine one or more characteristics of one or more assist features based on one or more parameters selected from a group consisting of: one or more characteristics of one or more design features in the portion, one or more characteristics of the patterning process, one or more characteristics of the lithographic apparatus, and/or a combination selected from the foregoing; determining the one or more characteristics of the one or more assist features using the one or more rules; wherein the one or more parameters comprise a spacing between a pair of facing edges; placing the one or more assist features onto the design layout; wherein the one or more assist features reduce tilt of Bossung curves of the portion.

According to an embodiment, a computer-implemented method to improve a patterning process for imaging a portion of a design layout onto a substrate using a lithographic apparatus, the portion comprising one or more assist features, comprises: obtaining one or more rules that adjust one or more characteristics of the assist features based on one or more parameters selected from a group consisting of: one or more characteristics of one or more design features in the portion, one or more characteristics of the patterning process, one or more characteristics of the lithographic apparatus, and/or a combination selected from the foregoing; adjusting the one or more characteristics of the assist features using the one or more rules; wherein the one or more parameters comprise a spacing between a pair of facing edges; placing the one or more assist features onto the design layout; wherein the one or more assist features reduce tilt of Bossung curves of the portion.

According to an embodiment, the method may further comprise representing the design layout with the one or more assist features on a patterning device.

According to an embodiment, a computer program product may comprise a non-transitory computer readable medium having the design layout with the one or more assist features recorded thereon.

The disclosure may be summarized in the following clauses:

1. A computer-implemented method to improve a patterning process of imaging a portion of a design layout onto a substrate using a lithographic apparatus, the method comprising:

obtaining one or more rules configured to determine one or more characteristics of one or more assist features based on one or more parameters selected from a group consisting of: one or more characteristics of one or more design features in the portion, one or more characteristics of the patterning process, one or more characteristics of the lithographic apparatus, and/or a combination selected from the foregoing;

determining, using the one or more rules, a distance between the one or more assist features and one of a pair of edges of the one or more design features, based on a spacing between the pair of edges such that the one or more assist features are asymmetrical with respect to the pair of edges; and placing the one or more assist features onto a patterning device.

2. The method of clause 1, where the one or more rules are configured to determine the one or more characteristics of the one or more assist features by binning the spacing.

3. The method of clause 1, further comprising determining the one or more characteristics of the one or more assist features using the one or more rules; wherein the one or more parameters comprise the spacing.

4. A computer-implemented method to improve a patterning process for imaging a portion of a design layout onto a substrate using a lithographic apparatus, the portion comprising one or more assist features, the method comprising:

obtaining one or more rules configured to adjust one or more characteristics of the assist features based on one or more parameters selected from a group consisting of: one or more characteristics of one or more design features in the portion, one or more characteristics of the patterning process, one or more characteristics of the lithographic apparatus, and/or a combination selected from the foregoing;

adjusting, using the one or more rules, a distance between the one or more assist features and one of a pair of edges of the one or more design features, based on a spacing between the pair of edges such that the one or more assist features are asymmetrical with respect to the pair of edges;

placing the one or more assist features onto a patterning device.

5. The method of clause 4, where the one or more rules are configured to adjust the one or more characteristics of the one or more assist features by binning the spacing.

6. The method of clause 4, further comprising adjusting the one or more characteristics of the one or more assist features using the one or more rules; wherein the one or more parameters comprise the spacing.

7. A computer-implemented method to improve a patterning process for imaging a portion of a design layout onto a substrate using a lithographic apparatus, the method comprising:

obtaining one or more rules applicable to a data structure representing the portion of the design layout, the one or more rules configured to determine one or more characteristics of a further data structure representing one or more assist features based on one or more parameters selected from a group consisting of: one or more characteristics of one or more design features in the portion, one or more characteristics of the patterning process, one or more characteristics of the lithographic apparatus, and/or a combination selected from the foregoing;

determining, using the one or more rules, a distance between the one or more assist features and one of a pair of edges of the one or more design features, based on a spacing between the pair of edges such that the one or more assist features are asymmetrical with respect to the pair of edges;

placing the further data structure representing the one or more assist features into the data structure representing the portion of the design layout.

8. The method of clause 7, further comprising determining the one or more characteristics of the further data structure representing the one or more assist features using the one or more rules; wherein the one or more parameters comprise the spacing.

9. A computer-implemented method to improve a patterning process for imaging a portion of a design layout onto a substrate using a lithographic apparatus, the method comprising:

obtaining one or more rules applicable to a data structure representing the portion of the design layout, the one or more rules configured to adjust one or more characteristics of a further data structure representing one or more assist features based on one or more parameters selected from a group consisting of: one or more characteristics of one or more design features in the portion, one or more characteristics of the patterning process, one or more characteristics of the lithographic apparatus, and/or a combination selected from the foregoing;

adjusting, using the one or more rules, a distance between the one or more assist features and one of a pair of edges of the one or more design features, based on a spacing between the pair of edges such that the one or more assist features are asymmetrical with respect to the pair of edges;

placing the further data structure representing the one or more assist features into the data structure representing the portion of the design layout.

10. The method of clause 9, further comprising adjusting the one or more characteristics of the further data structure representing the one or more assist features using the one or more rules; wherein the one or more parameters comprise the spacing.

11. The method of any one of clauses 7 to 10, further comprising configuring or manufacturing a patterning device representing the further data structure representing the one or more assist features.

12. The method of any one of clauses 1 to 11, wherein the characteristics of the assist features are selected from a group consisting of number of the assist features, position of the assist features, shape of the assist features, transmission of the assist features, phase of the assist features, relative position to a reference point on the design layout and a combination thereof.

13. The method of any one of clauses 1 to 12, wherein the one or more parameters comprise one or more of an orientation of a pair of edges, a slit position of a design feature, a size of a design feature, and a location of a design feature.

14. The method of any one of clauses 1 to 13, further comprising reducing pattern displacement error, contrast loss, best focus shift, tilt of a Bossung curve of the portion, or a combination selected from the foregoing, by adjusting one or more characteristics of an illumination source of the lithographic apparatus.

15. The method of any one of clauses 1 to 14, wherein placing the one or more assist features reduce pattern displacement error, contrast loss, best focus shift, tilt of a Bossung curve of the portion, or a combination selected from the foregoing.

16. The method of any one of clauses 14-15, wherein the one or more pattern displacement errors are pattern-dependent.

17. The method of clause 14, wherein adjusting one or more characteristics of an illumination source changes a symmetry of the illumination source, an intensity of all or a portion of the illumination source, or both.

18. The method of any of clauses 1 to 17, wherein the lithographic apparatus comprises projection optics comprising one or more reflective optical components.

19. The method of any of clauses 1 to 18, wherein the patterning process uses extreme ultra-violet radiation for imaging the portion of the design layout onto the substrate.

20. The method of any of clauses 1 to 19, wherein the lithographic apparatus comprises non-telecentric optics.

21. The method of any of clauses 1 to 20, wherein the portion of the design layout comprises one or more selected from: an entire design layout, a clip, a section of a design layout that is known to have a critical feature, and/or a section of the design layout where a critical feature has been identified by a pattern selection method.

22. The method of any of clauses 1 to 21, wherein the one or more assist features comprise a halftone assist feature, a phase-shifting assist feature, or both.

23. The method of clause 3, wherein determining the one or more characteristics of the one or more assist features using the one or more rules comprises interpolation or extrapolation.

24. The method of clause 6, wherein adjusting the one or more characteristics of the one or more assist features using the one or more rules comprises interpolation or extrapolation.

25. The method of clause 1 or clause 3, wherein the one or more assist features are placed between the pair of edges.

26. The method of any of clauses 1 to 25, further comprising adjusting the one or more assist features so as to meet a requirement of manufacturability.

27. The method of any of clauses 1 to 26, further comprising adjusting one or more characteristics of one or more assist features or of the further data structure, using a model.

28. The method of clause 27, wherein adjusting one or more characteristics of one or more assist features or of the further data structure, using a model comprises co-optimizing the one or more assist features with one or more of the design features, one or more parameters of the patterning process, one or more parameters of the lithographic apparatus, or a combination selected from the foregoing.

29. The method of any of clauses 1 to 28, further comprising adjusting one or more processing parameters of the patterning process to a value closer to a desired value, using a model.

30. The method of clause 29, further comprising using the model based one or more characteristics of one or more assist features or of the further data structure, determined by the one or more rules.

31. A computer program product comprising a non-transitory computer readable medium having instructions recorded thereon, the instructions when executed by a computer implementing the method of any of the above clauses.

32. A computer program product comprising a non-transitory computer readable medium having one or more rules recorded thereon, wherein the one or more rules determine one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing; wherein the one or more assist features are asymmetrical with respect to a pair of edges of the one or more design features.

33. A computer program product comprising a non-transitory computer readable medium having one or more rules recorded thereon, wherein the one or more rules adjust one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing; wherein the one or more assist features are asymmetrical with respect to a pair of edges of the one or more design features.

34. A computer program product comprising a non-transitory computer readable medium having instructions recorded thereon, the instructions when executed by a computer determining one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing; wherein the one or more assist features are asymmetrical with respect to a pair of edges of the one or more design features.

35. A computer program product comprising a non-transitory computer readable medium having instructions recorded thereon, the instructions when executed by a computer adjusting one or more characteristics of one or more assist features based on one or more parameters selected from a group consisting of: one or more characteristics of one or more design features in a portion of a design layout, one or more characteristics of a patterning process, one or more characteristics of a lithographic apparatus, and/or a combination selected from the foregoing; wherein the one or more assist features are asymmetrical with respect to a pair of edges of the one or more design features.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

The descriptions above are intended to be illustrative, not limiting. Thus, it will be apparent to one skilled in the art that modifications may be made to the embodiments as described without departing from the scope of the claims set out below.

What is claimed is:

1. A method to improve a patterning process of imaging a portion of a design layout onto a substrate using a lithographic apparatus, the method comprising:
    obtaining one or more rules configured to determine one or more characteristics of one or more assist features based on one or more parameters selected from: one or more characteristics of one or more design features in the portion, one or more characteristics of the patterning process, one or more characteristics of the lithographic apparatus, and/or a combination selected from the foregoing; and
    determining, by a hardware computer using the one or more rules, an asymmetry of spacing of the one or more assist features with respect to a pair of edges of one or more design features in the portion or an asymmetry of one assist feature with respect to another assist feature in relation to a pair of edges of one or more design features in the portion, wherein the one or more parameters comprises an orientation of the pair of edges and the one or more rules provide a different asymmetry depending on the orientation of the pair of edges.

2. The method of claim 1, where the one or more rules are configured to determine the one or more characteristics of the one or more assist features by binning a spacing between the pair of edges.

3. The method of claim 1, further comprising determining the one or more characteristics of the one or more assist features using the one or more rules, wherein the one or more parameters comprise a spacing between the pair of edges.

4. The method of claim 1, wherein the one or more characteristics of the one or more assist features are one or more selected from: number of the one or more assist features, position of the one or more assist features, shape of the one or more assist features, transmission of the one or more assist features, phase of the one or more assist features, and/or relative position to a reference point on the design layout.

5. The method of claim 1, wherein the one or more parameters further comprise one or more selected from: a slit position of a design feature, a size of a design feature, and/or a location of a design feature.

6. The method of claim 1, further comprising reducing pattern displacement error, contrast loss, best focus shift, tilt of a Bossung curve of the portion, or a combination selected from the foregoing, by adjusting one or more characteristics of illumination by the lithographic apparatus.

7. The method of claim 6, wherein adjusting one or more characteristics of the illumination changes a symmetry of the illumination, an intensity of all or a portion of the illumination, or both.

8. The method of claim 1, wherein the one or more assist features in the portion of the design layout reduce pattern displacement error, contrast loss, best focus shift, tilt of a Bossung curve of the portion, or a combination selected from the foregoing.

9. The method of claim 1, wherein the lithographic apparatus comprises projection optics comprising one or more reflective optical components.

10. The method of claim 1, wherein the lithographic apparatus comprises non-telecentric optics.

11. The method of claim 1, wherein the one or more assist features are placed between the pair of edges.

12. The method of claim 1, further comprising adjusting one or more characteristics of one or more assist features using a model.

13. The method of claim 12, wherein adjusting one or more characteristics of one or more assist features using a model comprises co-optimizing the one or more assist features with one or more selected from: one or more design features, one or more parameters of the patterning process, and/or one or more parameters of the lithographic apparatus.

14. The method of claim 1, further comprising placing data regarding the one or more assist features into a data structure representing the portion of the design layout for imaging using a patterning device.

15. A non-transitory computer readable medium have instructions therein, the instructions, upon execution by a computer system, configured to cause the computer system to at least:
  obtain one or more rules configured to determine one or more characteristics of one or more assist features based on one or more parameters selected from: one or more characteristics of one or more design features in the portion, one or more characteristics of the patterning process, one or more characteristics of the lithographic apparatus, and/or a combination selected from the foregoing; and
  determine, using the one or more rules, an asymmetry of spacing of the one or more assist features with respect to a pair of edges of one or more design features in the portion or an asymmetry of one assist feature with respect to another assist feature in relation to a pair of edges of one or more design features in the portion, wherein the parameter comprises an orientation of the pair of edges and the one or more rules provide a different asymmetry depending on the orientation of the pair of edges.

16. A non-transitory computer-readable medium having instructions therein, the instructions, upon execution by a computer system, configured to cause the computer system to at least:
  determine and provide a symmetric arrangement of one or more assist features with respect to a pair of edges of one or more design features in a portion of a design layout for imaging onto a substrate using a lithographic apparatus by a patterning process;
  obtain one or more rules configured to determine one or more characteristics of one or more assist features based on one or more parameters selected from: one or more characteristics of one or more design features in the portion of the design layout, one or more characteristics of the patterning process, and/or one or more characteristics of the lithographic apparatus; and
  determine, using the rule, a modification to the symmetric arrangement in the design layout to change the symmetric arrangement to an asymmetric arrangement of the one or more assist features in the design layout.

17. The computer-readable medium of claim 16, wherein the modification comprises a change to convert a symmetrical spacing of the one or more assist features with respect to a pair of edges to an asymmetrical spacing of the one or more assist features with respect to the pair of edges or a change of shape type, transmission, and/or phase of one assist feature with respect to another assist feature in relation to the pair of edges.

18. The computer-readable medium of claim 16, wherein the instructions are further configured to cause the computer system to adjust one or more characteristics of one or more assist features using a model.

19. A non-transitory computer-readable medium having instructions therein, the instructions, upon execution by a computer system, configured to cause the computer system to at least:
  obtain one or more rules configured to determine one or more characteristics of one or more assist features based on one or more parameters selected from: one or more characteristics of one or more design features in a portion of a design layout for imaging onto a substrate using a lithographic apparatus by a patterning process, one or more characteristics of the patterning process, and/or one or more characteristics of the lithographic apparatus; and
  determine, using the rule, an asymmetric arrangement of assist features with respect to a pair of edges of one or more design features in the portion, wherein the asymmetric arrangement comprises a difference in shape type, transmission, and/or phase of one of the assist features with respect to another of the assist features.

20. The computer-readable medium of claim 19, wherein the instructions are further configured to determine a distance between at least one assist feature and an edge of the pair of edges, based on a spacing between the pair of edges such that the at least one assist feature is asymmetrically spaced with respect to the pair of edges.

21. The computer-readable medium of claim 19, wherein the instructions are further configured to cause the computer system to adjust one or more characteristics of one or more assist features using a model.

22. The computer-readable medium of claim 19, wherein the instructions are further configured to cause the computer system to place data regarding the one or more assist features into a data structure representing the portion of the design layout for imaging using a patterning device.

* * * * *